United States Patent
Saenz et al.

(10) Patent No.: US 9,748,479 B2
(45) Date of Patent: Aug. 29, 2017

(54) MEMORY CELLS INCLUDING VERTICALLY ORIENTED ADJUSTABLE RESISTANCE STRUCTURES

(71) Applicant: SANDISK TECHNOLOGIES LLC, Plano, TX (US)

(72) Inventors: Juan P. Saenz, Menlo Park, CA (US); Christopher J. Petti, Mountain View, CA (US)

(73) Assignee: SanDisk Technologies LLC, Plano, TX (US)

(*) Notice: Subject to any disclaimer, the term of this patent is extended or adjusted under 35 U.S.C. 154(b) by 0 days.

(21) Appl. No.: 15/420,595

(22) Filed: Jan. 31, 2017

(65) Prior Publication Data

US 2017/0141304 A1 May 18, 2017

Related U.S. Application Data

(63) Continuation of application No. 14/869,231, filed on Sep. 29, 2015, now Pat. No. 9,576,657.

(51) Int. Cl.
*G11C 11/00* (2006.01)
*H01L 45/00* (2006.01)
*H01L 27/24* (2006.01)
*H01L 27/22* (2006.01)

(52) U.S. Cl.
CPC ........ *H01L 45/1233* (2013.01); *H01L 27/222* (2013.01); *H01L 27/2463* (2013.01); *H01L 45/06* (2013.01); *H01L 45/08* (2013.01); *H01L 45/146* (2013.01); *H01L 45/1608* (2013.01)

(58) Field of Classification Search
CPC ............ G11C 13/0069; G11C 13/0002; G11C 11/5678
See application file for complete search history.

(56) References Cited

U.S. PATENT DOCUMENTS

| | | | |
|---|---|---|---|
| 6,052,310 A * | 4/2000 | Sunkavalli | G11C 16/16 365/185.21 |
| 2004/0184331 A1 | 9/2004 | Hanzawa et al. | |
| 2004/0252576 A1 * | 12/2004 | Hofmann | H01L 27/115 365/232 |
| 2009/0316492 A1 * | 12/2009 | Widjaja | G11C 11/404 365/189.2 |
| 2010/0271861 A1 * | 10/2010 | Kitagawa | G11C 13/0009 365/148 |

(Continued)

OTHER PUBLICATIONS

Burr et al., "Access devices for 3D crosspoint memory", J. Vac. Sci. Technol. B, vol. 32, No. 4, Jul./Aug. 2014.

(Continued)

*Primary Examiner* — Tuan T Nguyen
(74) *Attorney, Agent, or Firm* — Vierra Magen Marcus LLP

(57) ABSTRACT

A memory cell is provided that includes a vertically-oriented adjustable resistance material layer, a control terminal disposed adjacent the vertically-oriented adjustable resistance material layer and coupled to a word line, and a reversible resistance-switching element disposed on the vertically-oriented adjustable resistance material layer. The control terminal is configured to adjust a resistance of the vertically-oriented adjustable resistance material layer.

20 Claims, 31 Drawing Sheets

(56) References Cited

U.S. PATENT DOCUMENTS

| | | | |
|---|---|---|---|
| 2011/0228586 A1* | 9/2011 | Kawabata | G11C 13/004 |
| | | | 365/148 |
| 2013/0077384 A1 | 3/2013 | Azuma et al. | |
| 2014/0098594 A1* | 4/2014 | Azuma | H01L 27/2418 |
| | | | 365/148 |
| 2014/0104931 A1* | 4/2014 | Katoh | G11C 13/0007 |
| | | | 365/148 |
| 2014/0301130 A1 | 10/2014 | Siau et al. | |
| 2015/0243352 A1* | 8/2015 | Park | G11C 11/5642 |
| | | | 365/163 |
| 2015/0270312 A1 | 9/2015 | Tajima et al. | |

OTHER PUBLICATIONS

International Search Report and Written Opinion dated Sep. 1, 2016, in International Patent Application No. PCT/US2016/036341.
Notice of Allowance and Fee(s) Due dated Oct. 24, 2016 in U.S. Appl. No. 14/869,231.

* cited by examiner

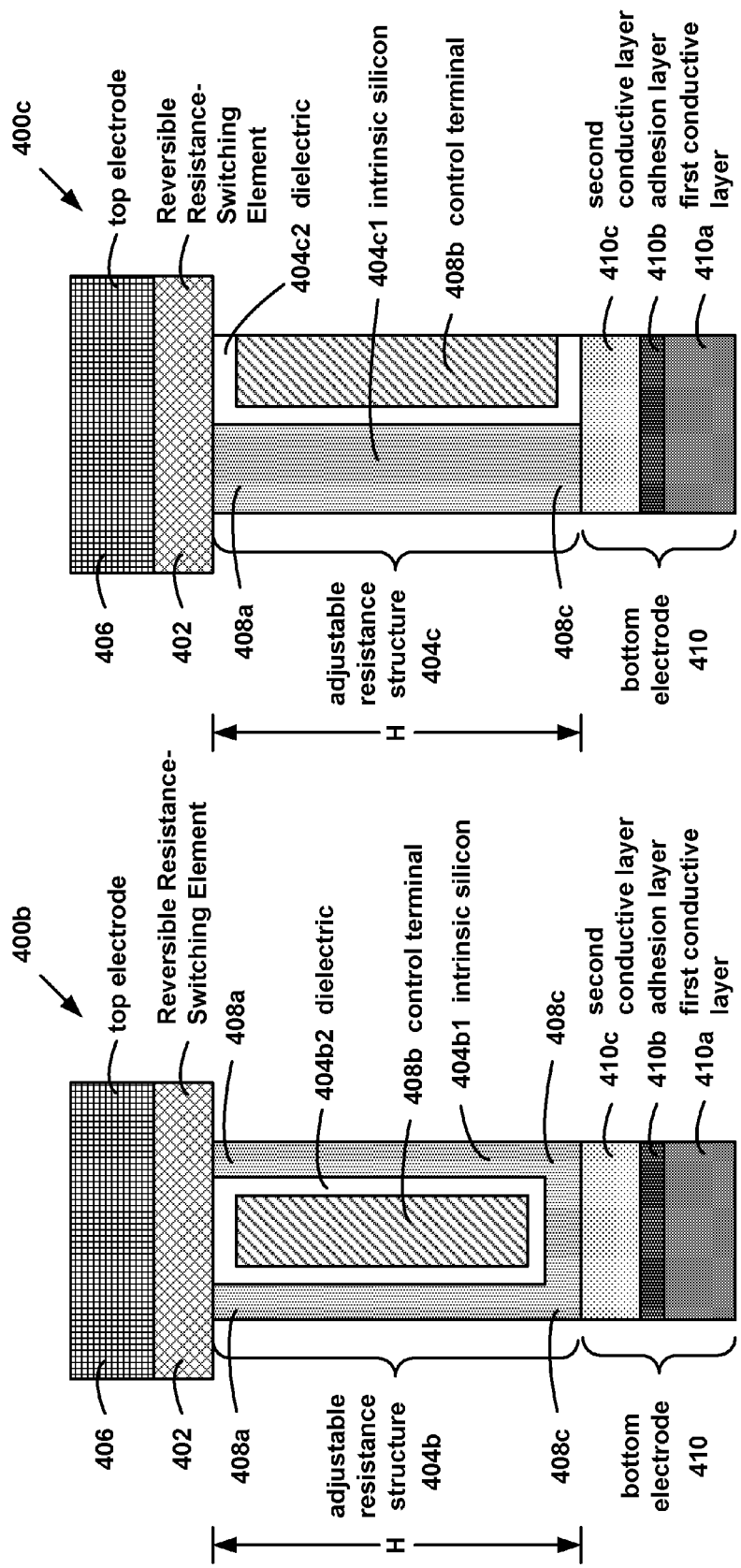

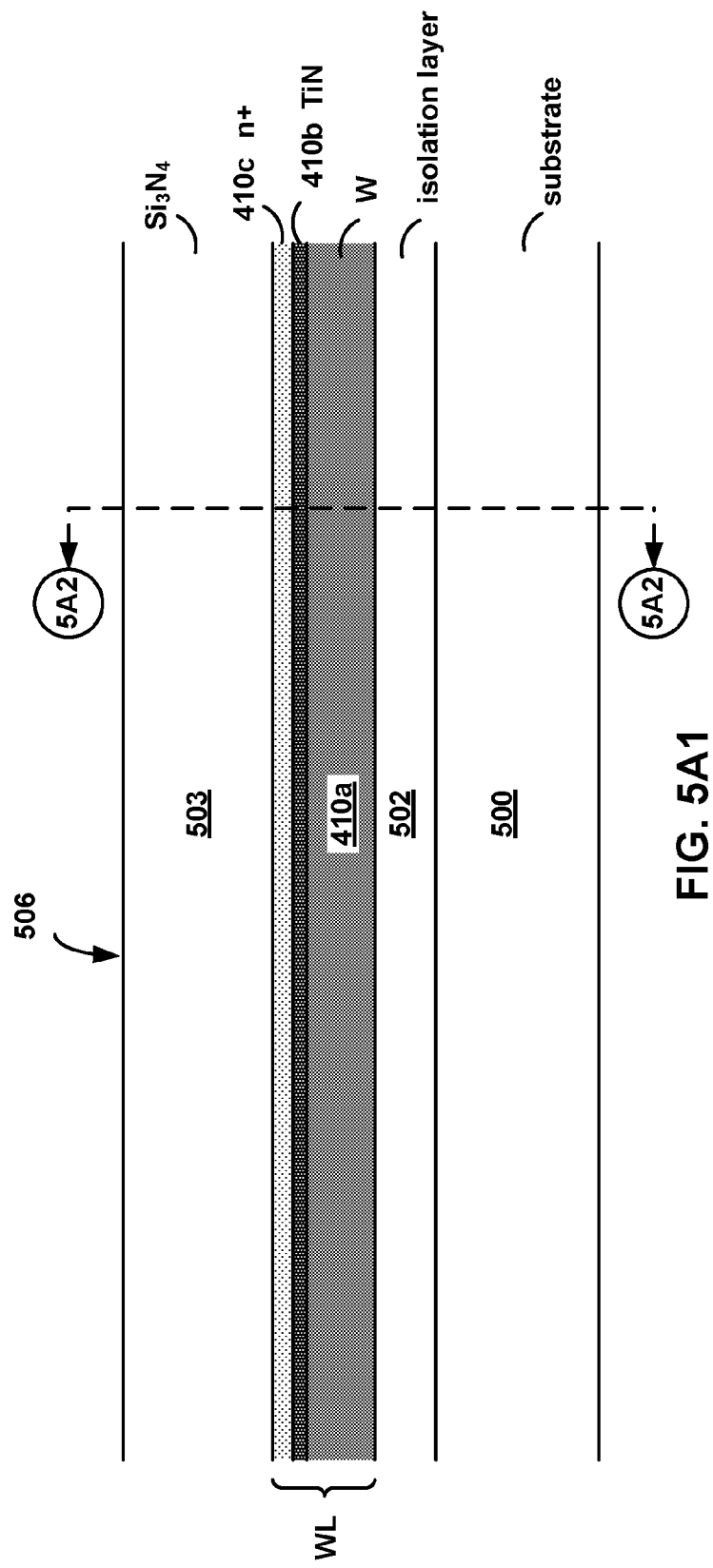
FIG. 5A1

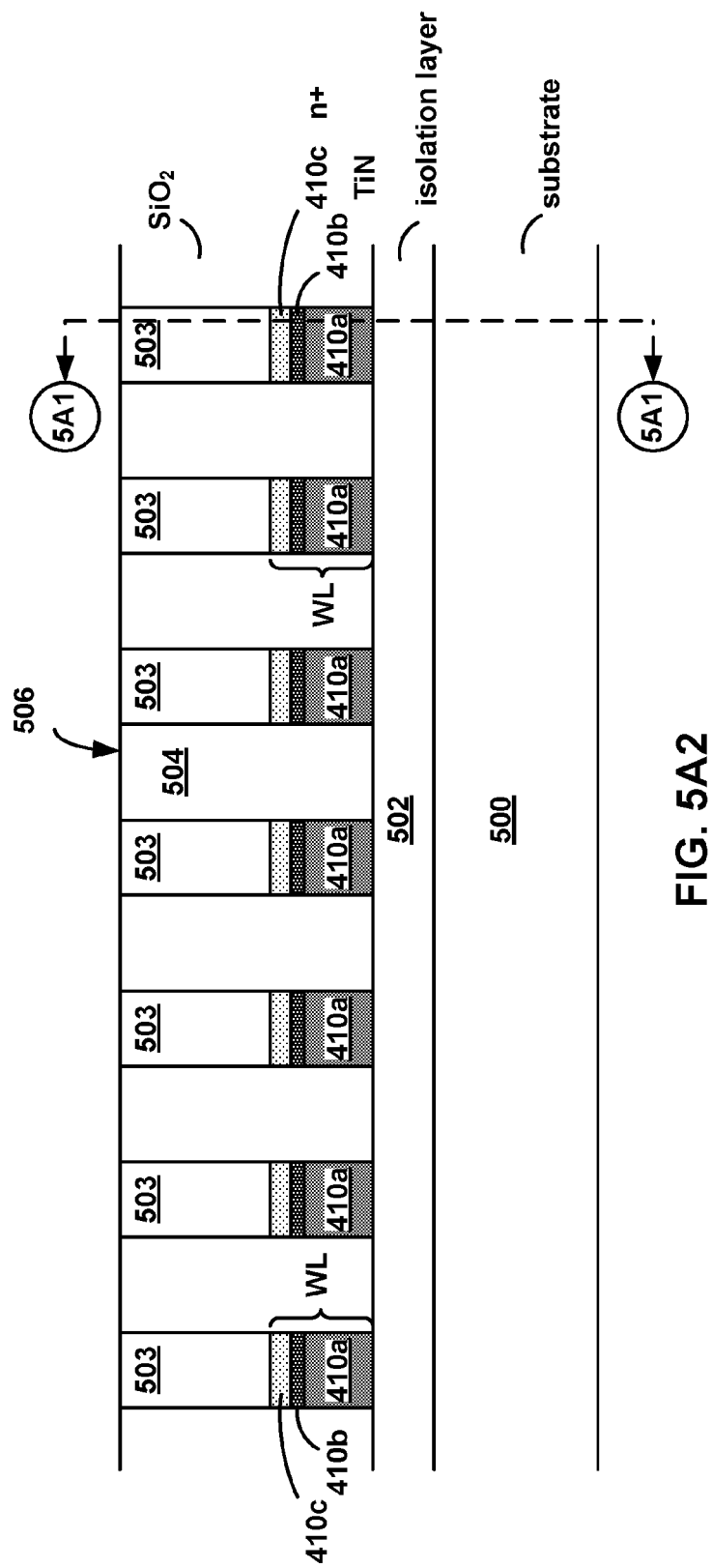
FIG. 5A2

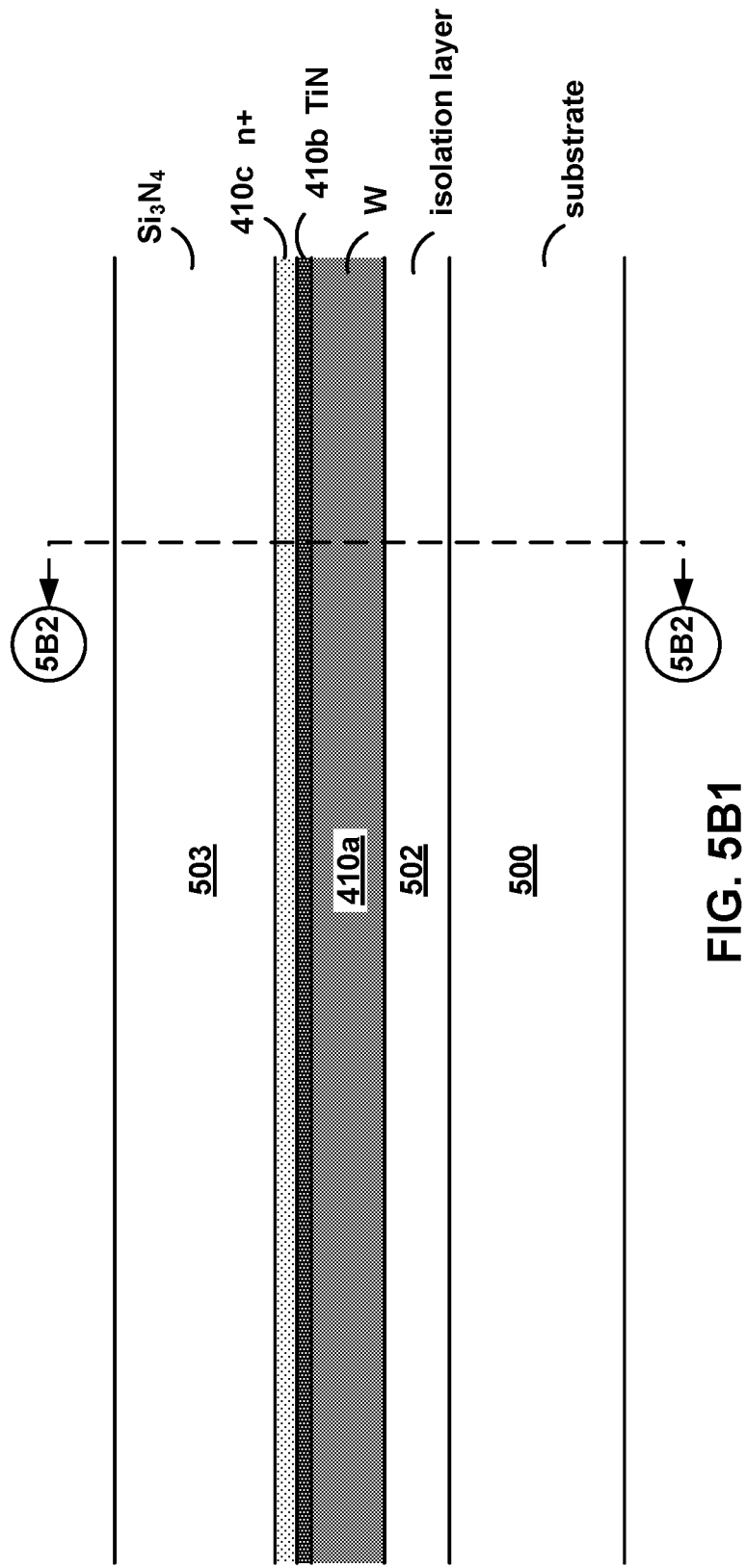
FIG. 5B1

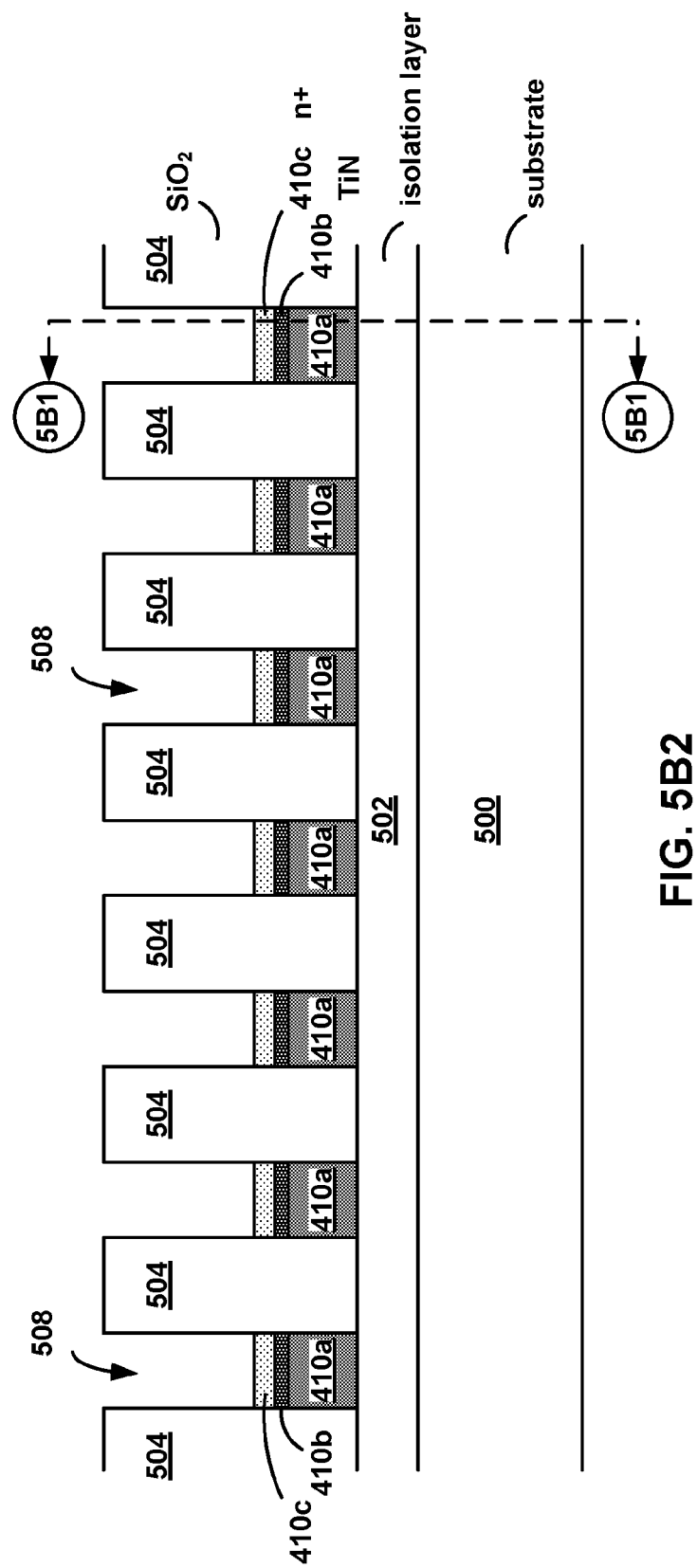
FIG. 5B2

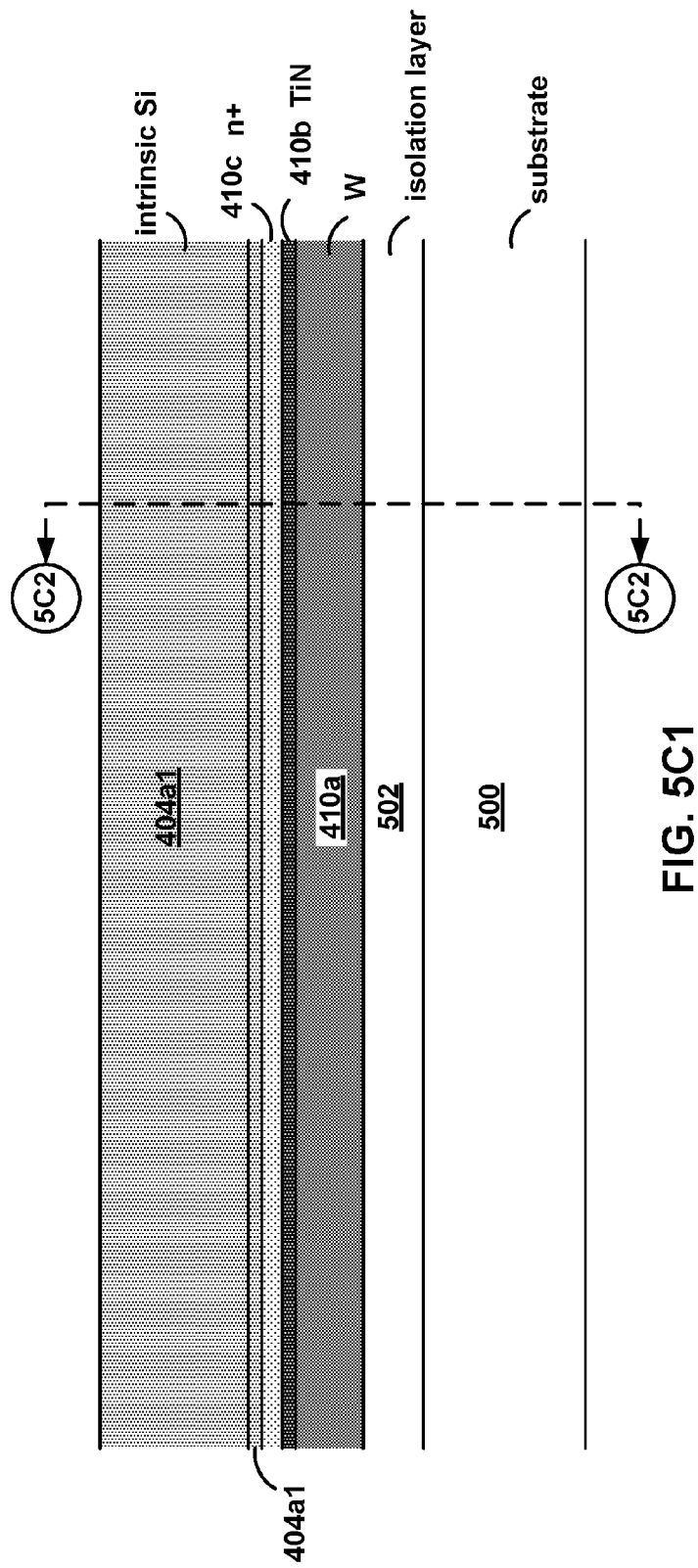

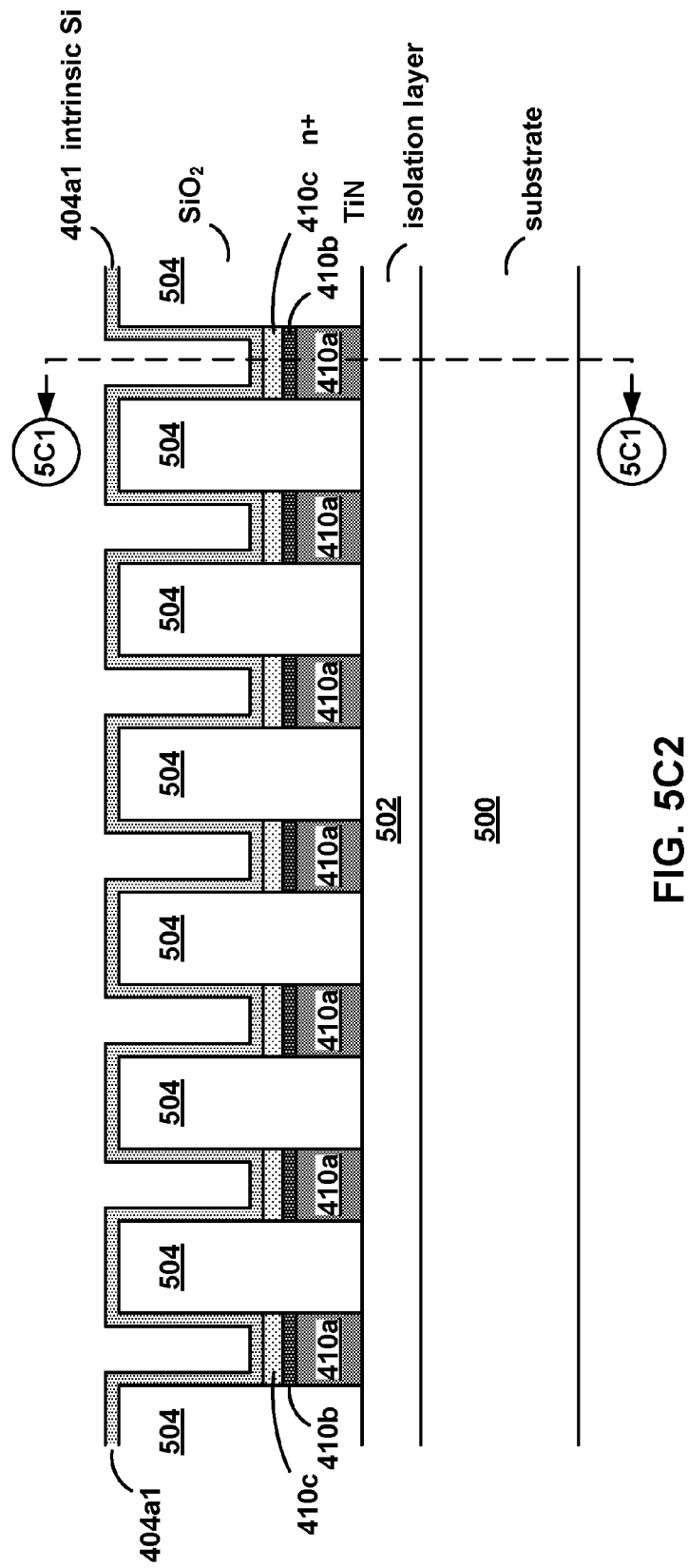
FIG. 5C2

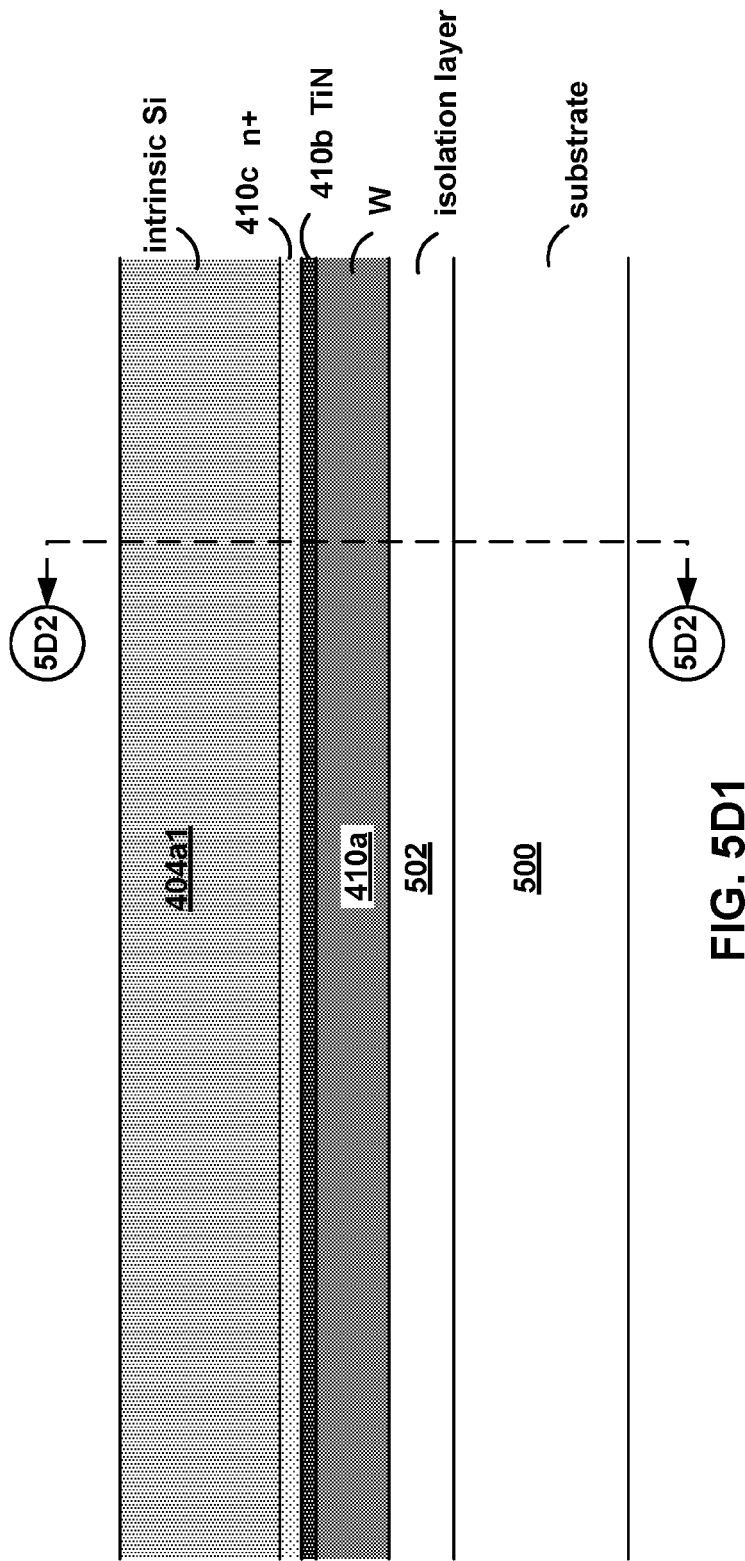
FIG. 5D1

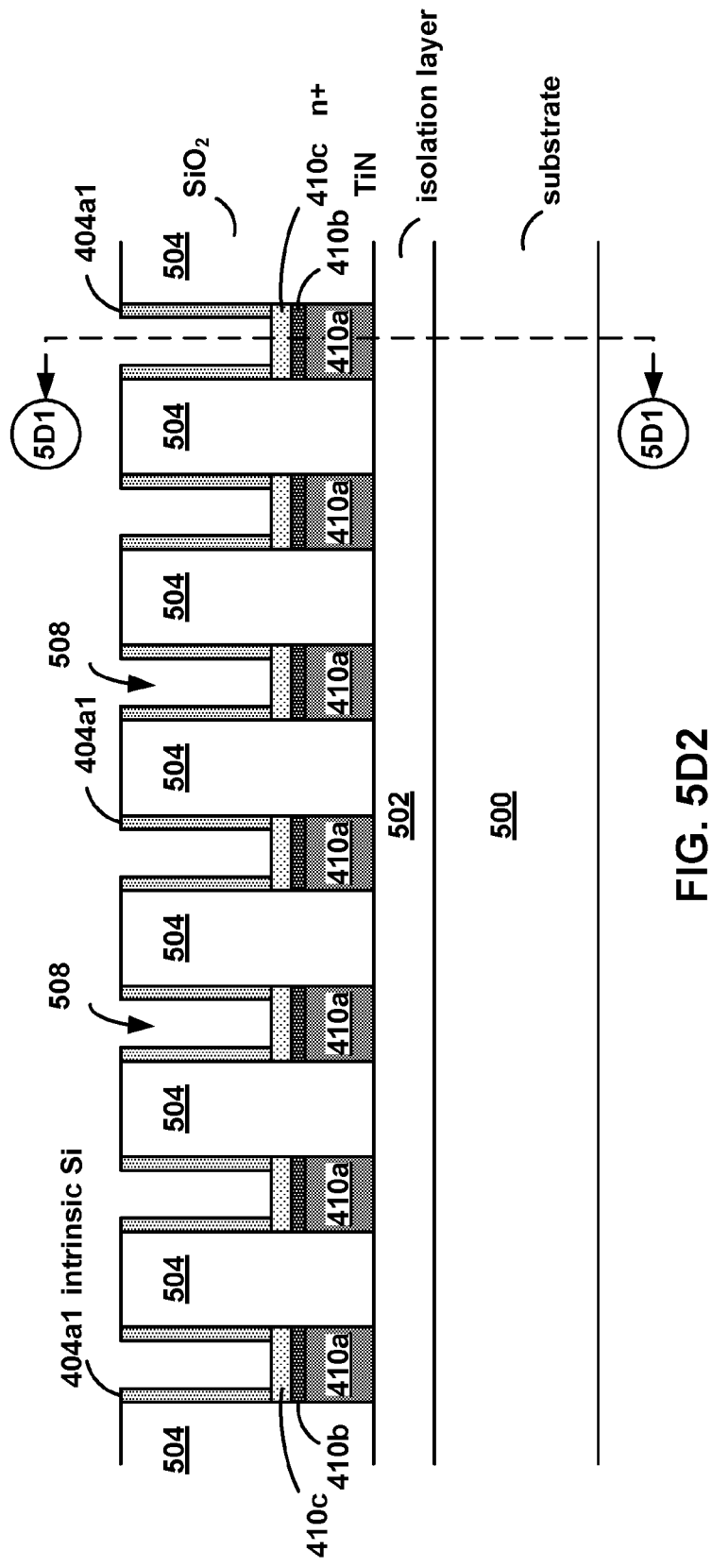
FIG. 5D2

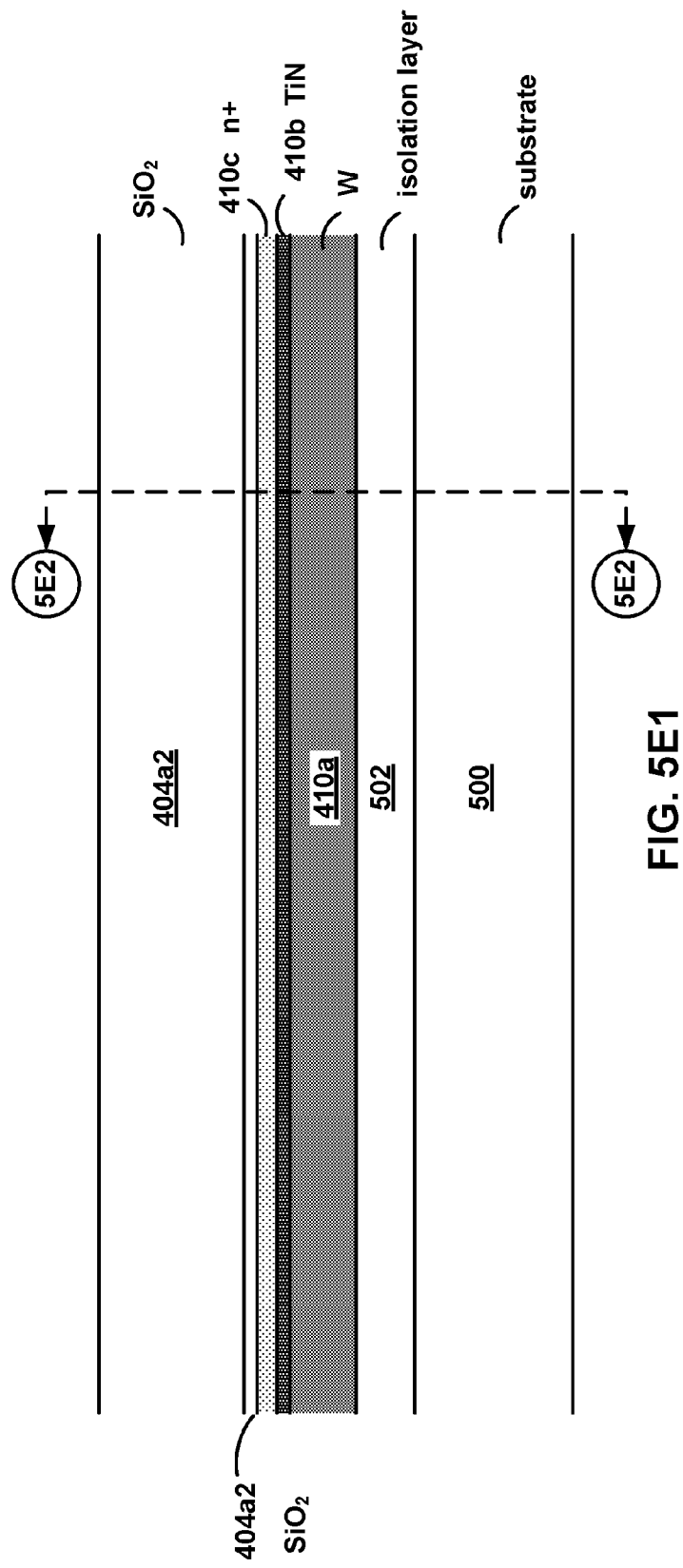
FIG. 5E1

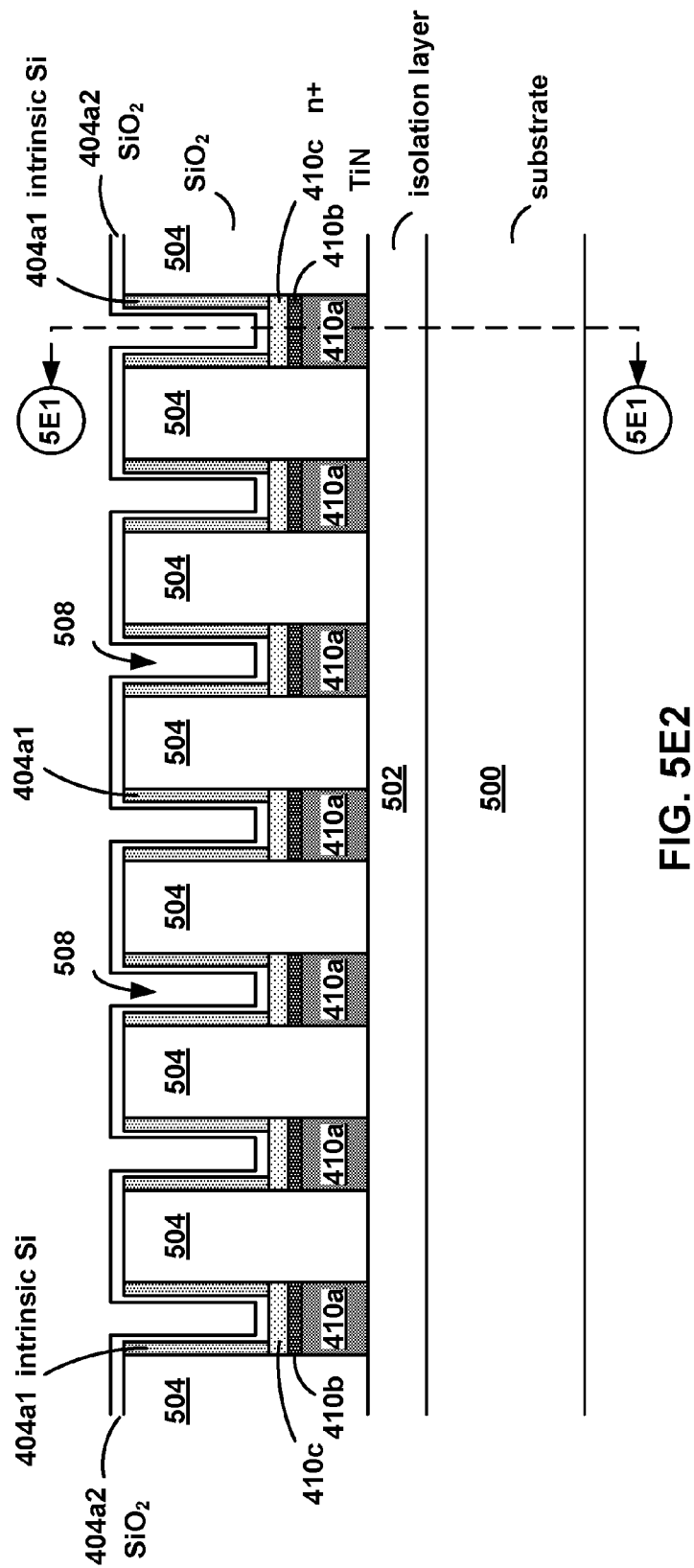
FIG. 5E2

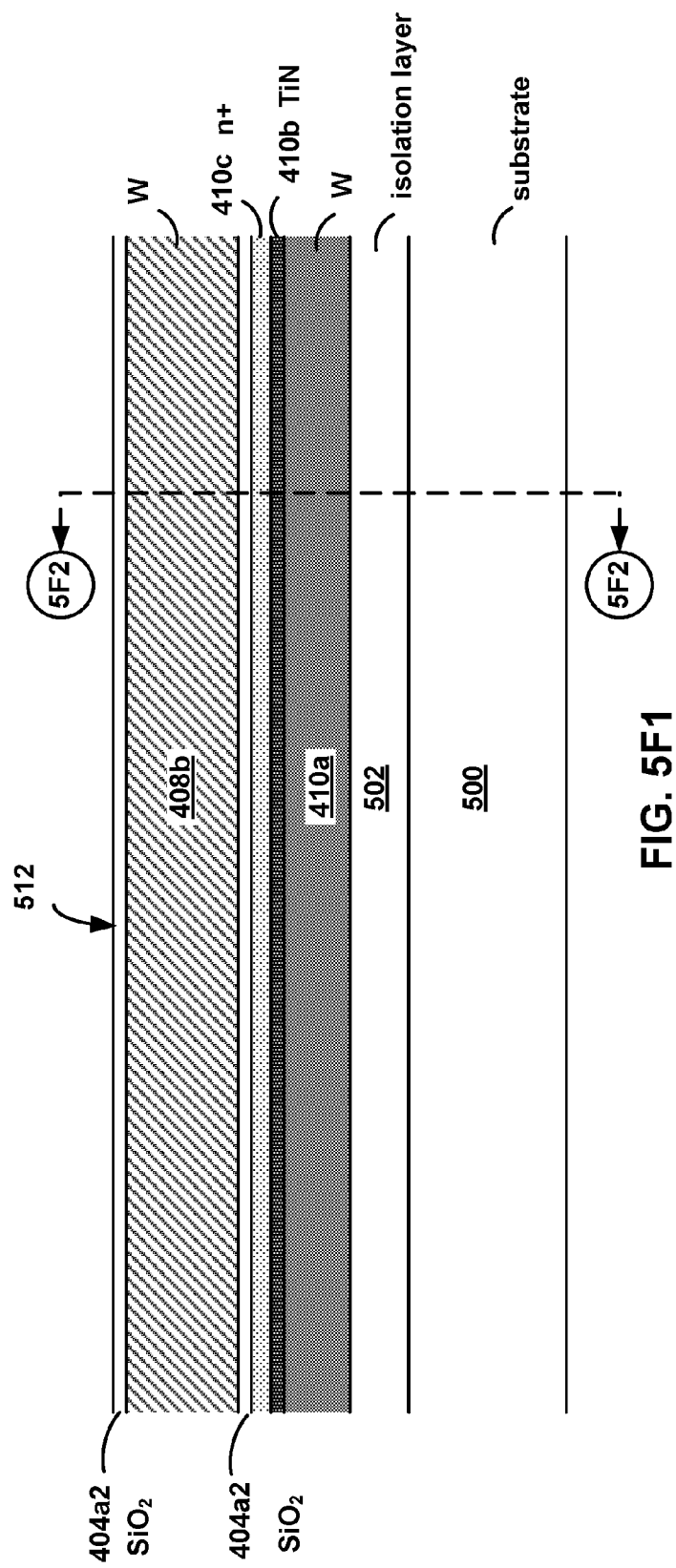
FIG. 5F1

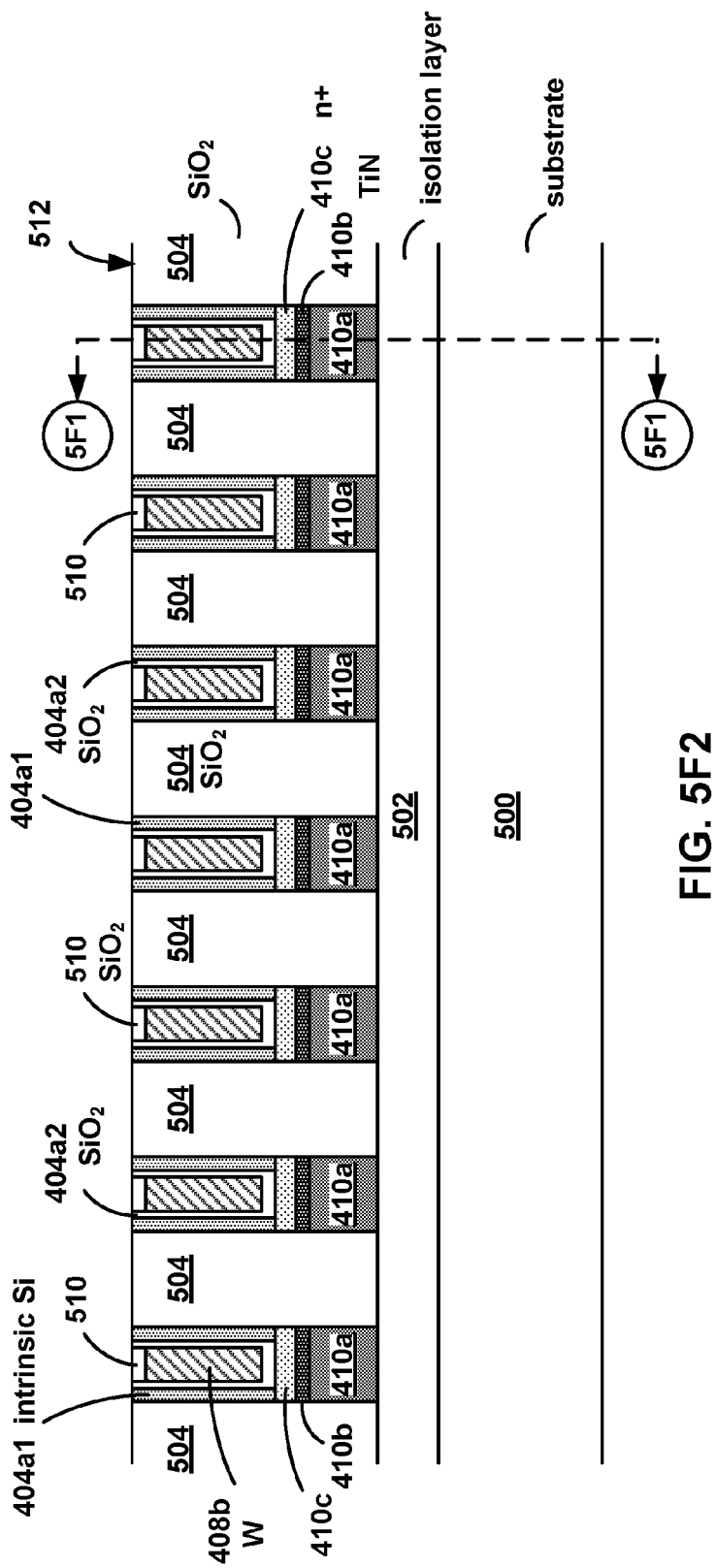
FIG. 5F2

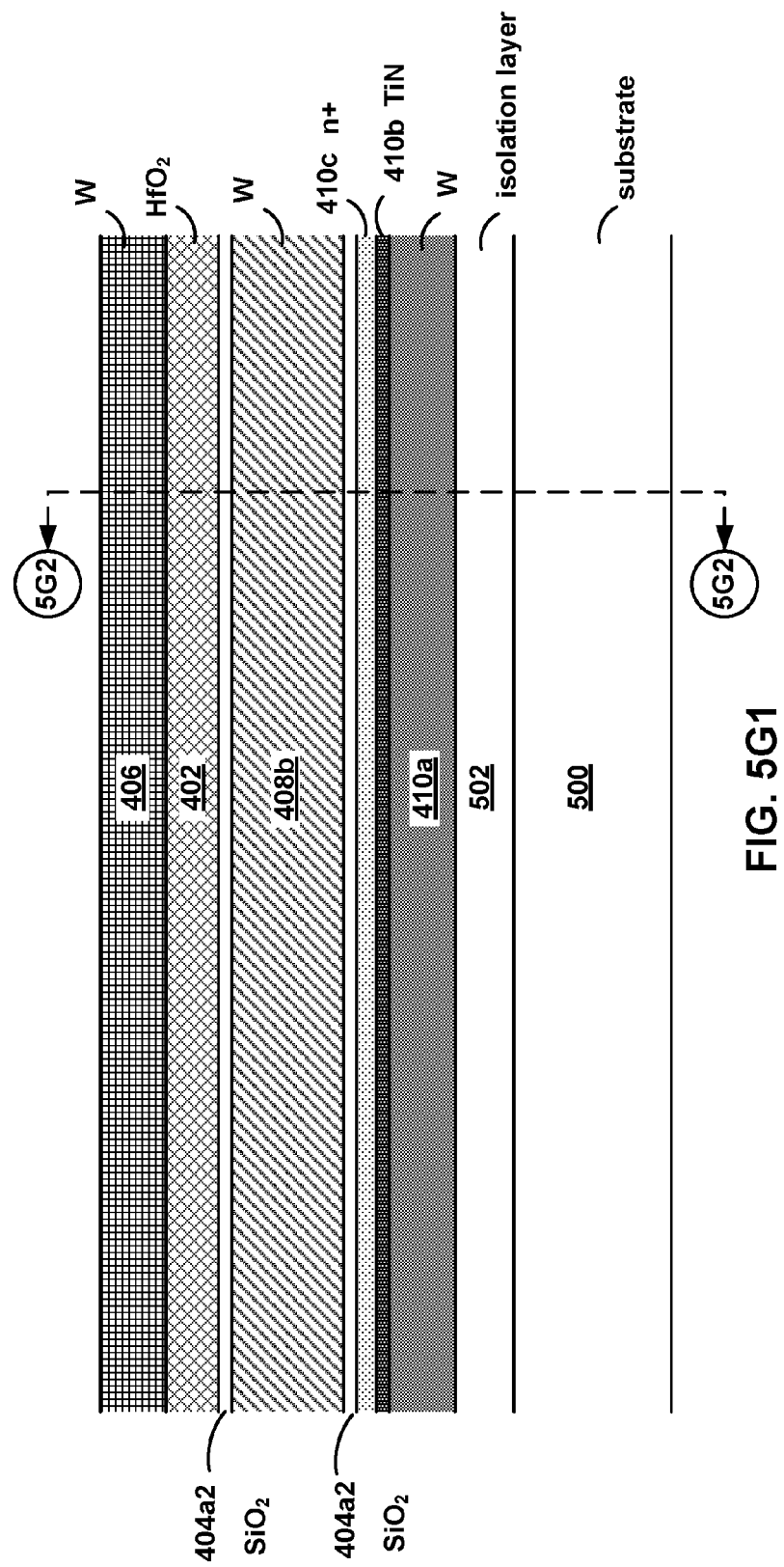

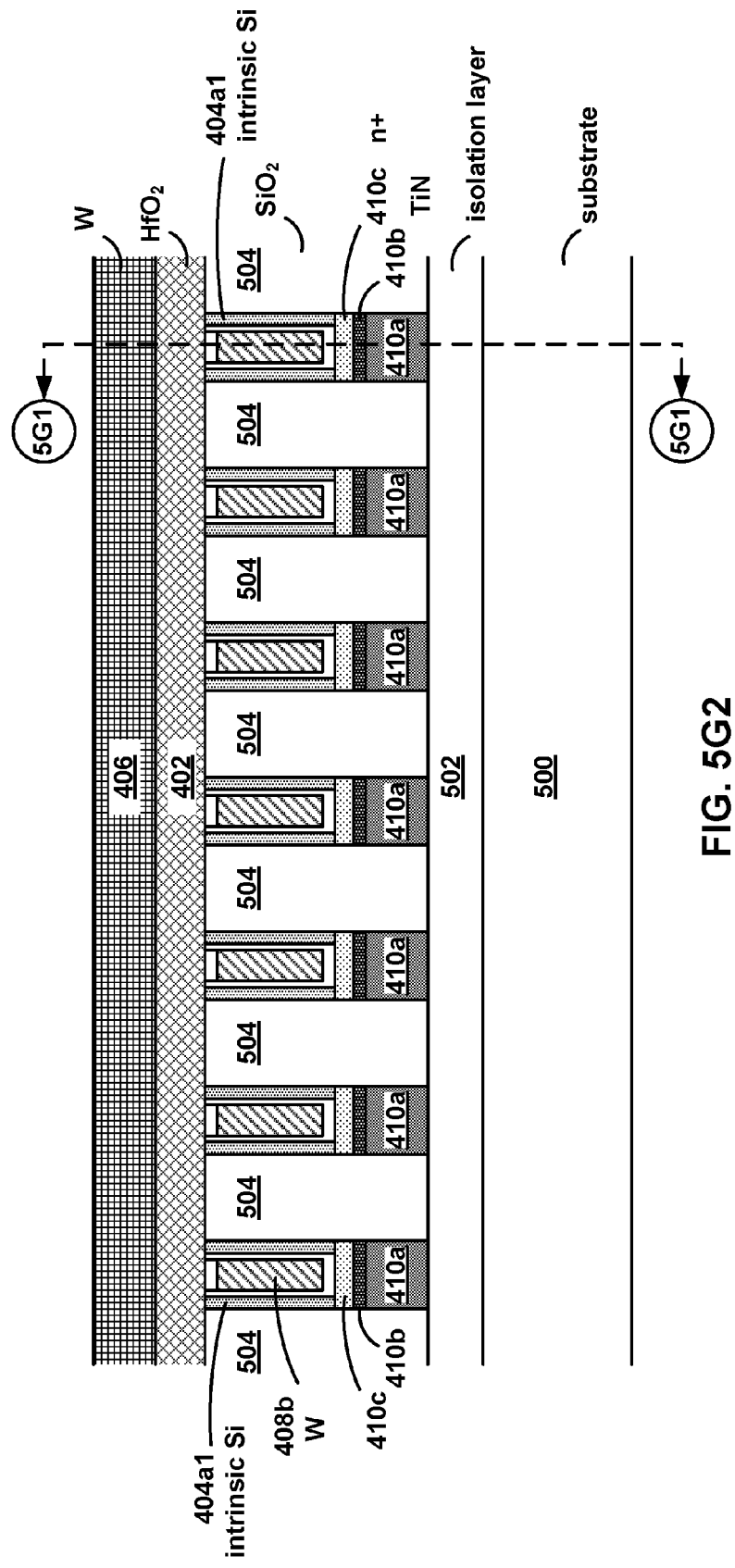
FIG. 5G2

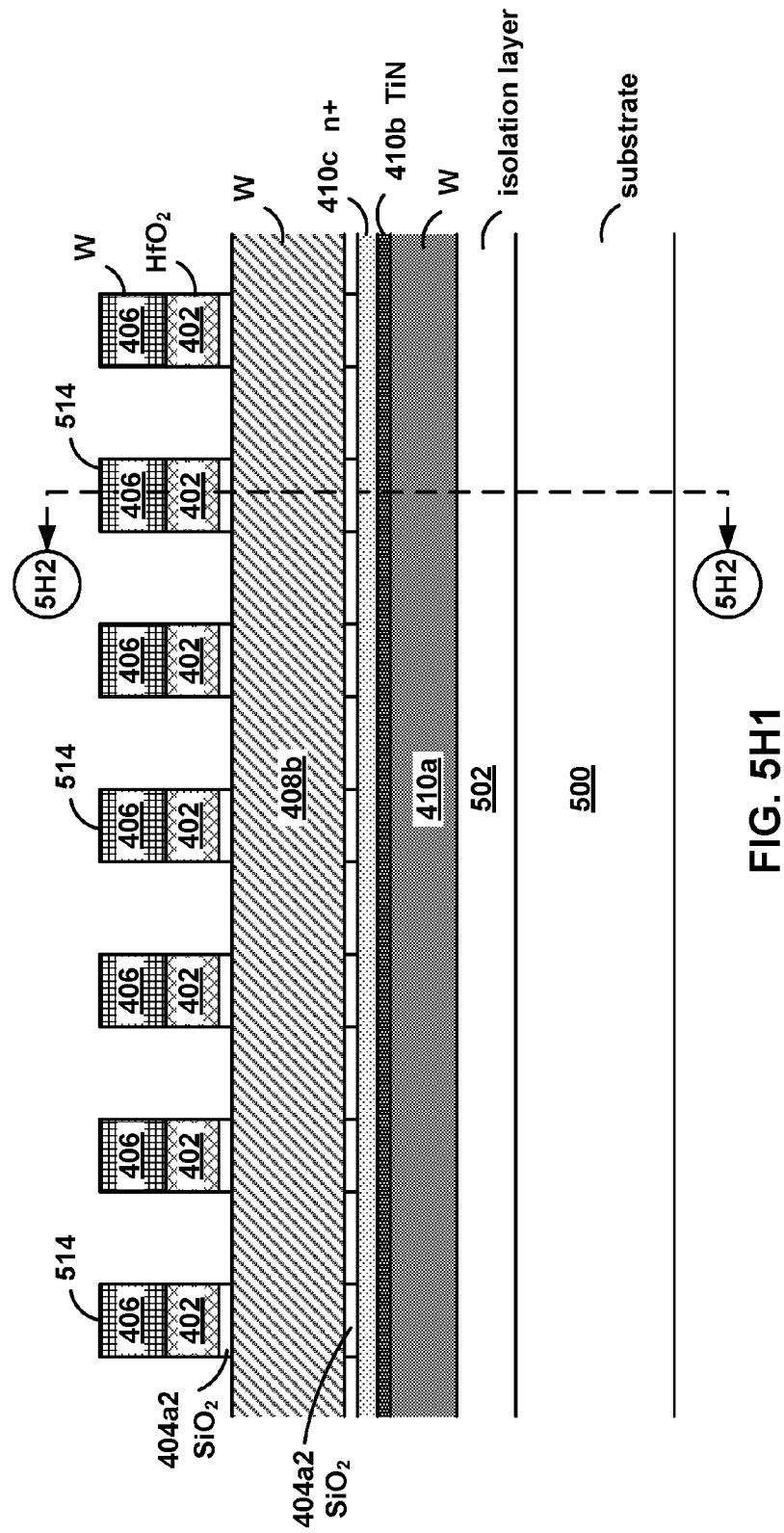
FIG. 5H1

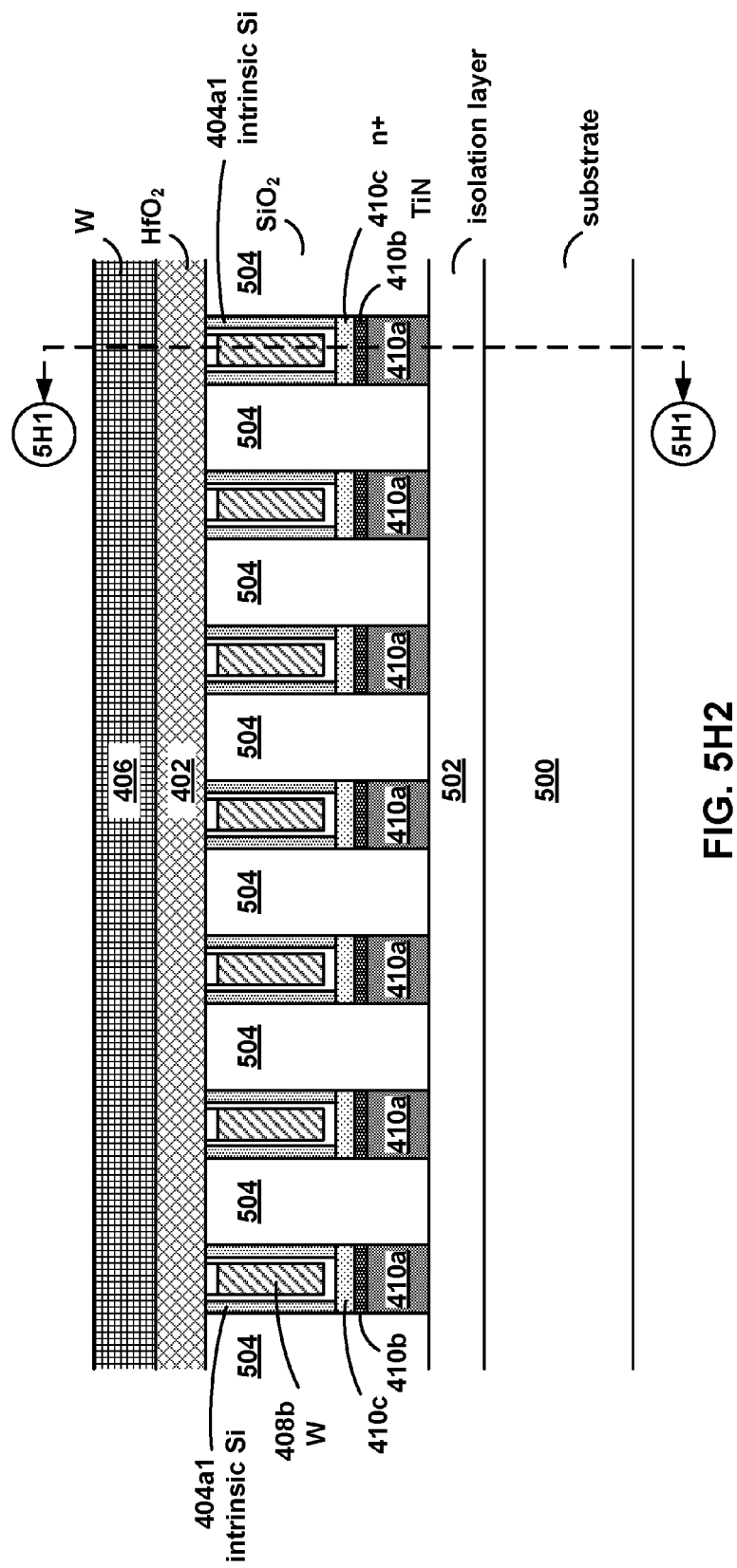
FIG. 5H2

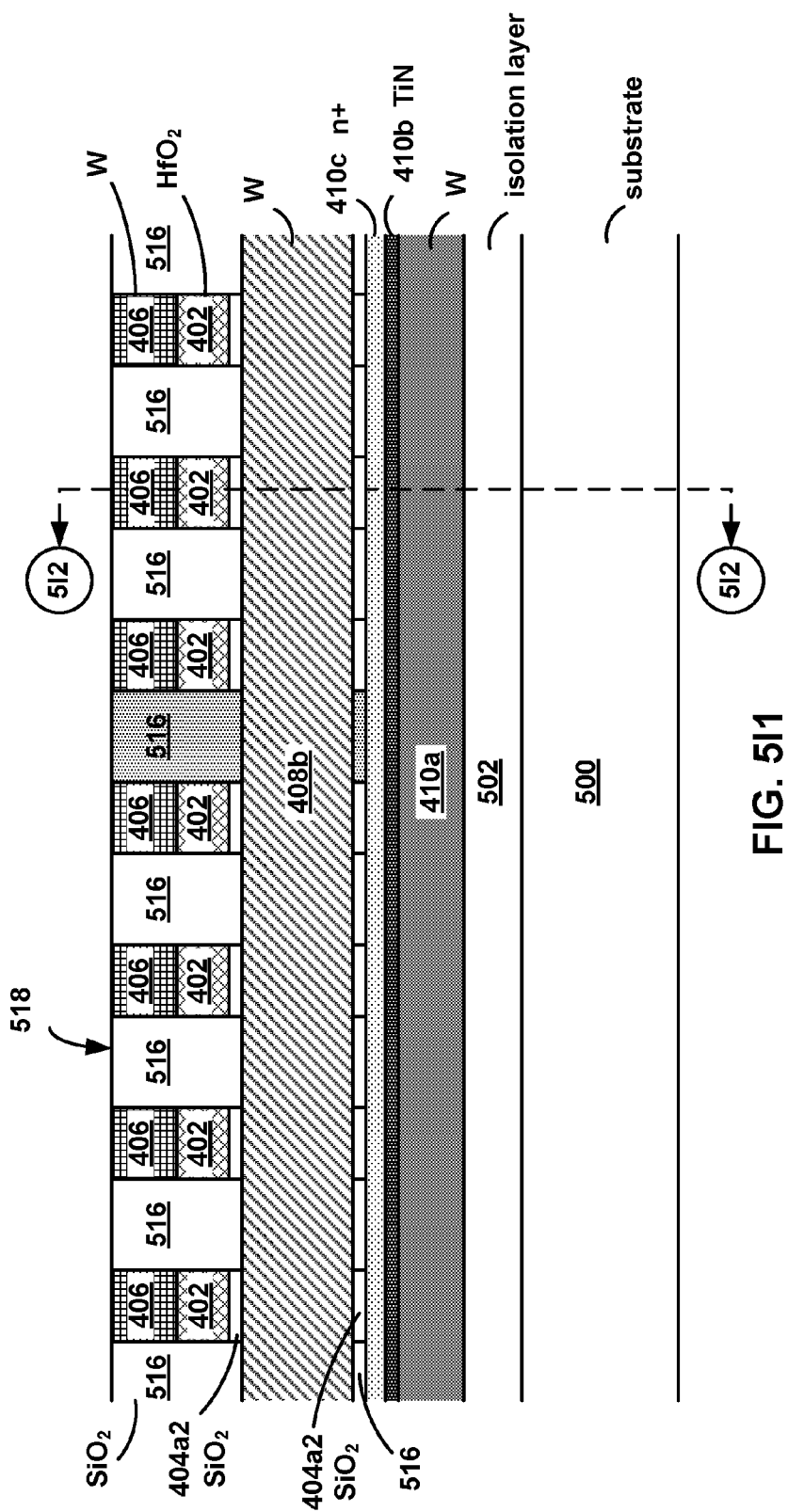
FIG. 5I1

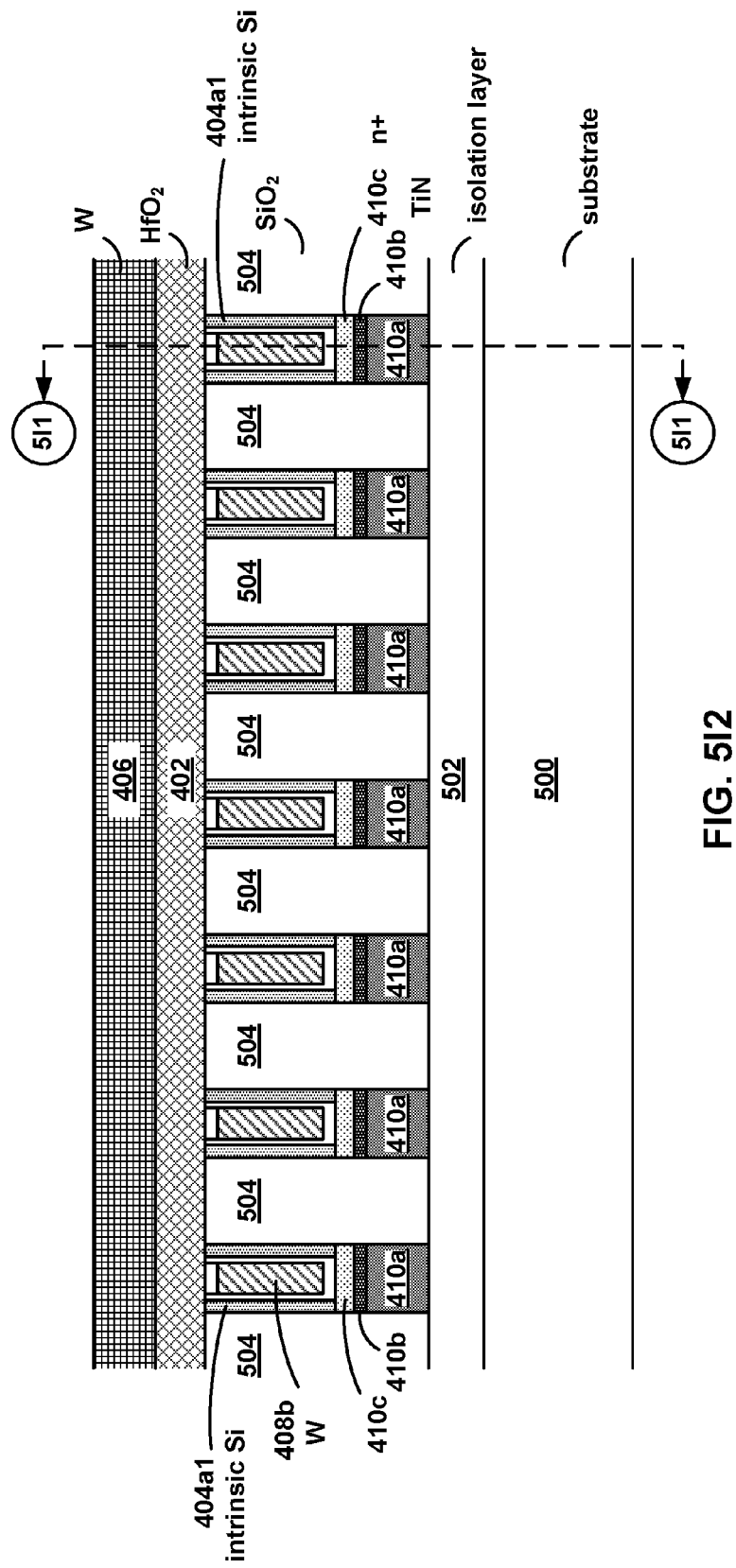
FIG. 5I2

MEMORY CELLS INCLUDING VERTICALLY ORIENTED ADJUSTABLE RESISTANCE STRUCTURES

PRIORITY DATA

This application is a continuation of U.S. patent application Ser. No. 14/869,231, filed Sep. 29, 2015, which is incorporated by reference herein in its entirety for all purposes.

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). In recent years, non-volatile memory devices have been scaled in order to reduce the cost per bit. However, as process geometries shrink, many design and process challenges are presented.

BRIEF DESCRIPTION OF THE DRAWINGS

FIGS. 4B-4D depict cross-sectional views of example implementations of the memory cell of FIG. 4A.

FIGS. 5A1-5I2 are cross-sectional views of a portion of a substrate during an example fabrication of the memory array of FIG. 3A.

DETAILED DESCRIPTION

A memory cell is provided that includes a vertically-oriented adjustable resistance structure including a control terminal coupled to a word line, and a reversible resistance-switching element coupled in series with and disposed above or below the vertically-oriented adjustable resistance structure. In an embodiment, the vertically-oriented adjustable resistance structure has a first conducting state and a second conducting state. Applying a first voltage to the control terminal sets the vertically-oriented adjustable resistance structure to a low resistance, and applying a second voltage to the control terminal sets the vertically-oriented adjustable resistance structure to a high resistance. In an embodiment, the vertically-oriented adjustable resistance structure functions as a steering element for the memory cell.

In an embodiment, memory cells within a memory array may include re-writable non-volatile memory cells including a reversible resistance-switching element. A reversible resistance-switching element may include a reversible resistivity-switching material having a resistivity that may be reversibly switched between two or more states. In an embodiment, the reversible resistance-switching material may include a metal oxide, solid electrolyte, phase-change material, magnetic material, or other similar resistivity-switching material. Various metal oxides can be used, such as transition metal-oxides. Examples of metal-oxides include, but are not limited to, NiO, $Nb_2O_5$, $TiO_2$, $HfO_2$, $Al_2O_3$, $MgO_x$, $CrO_2$, VO, BN, $TaO_2$, $Ta_2O_3$, and AlN.

Figure 1A:
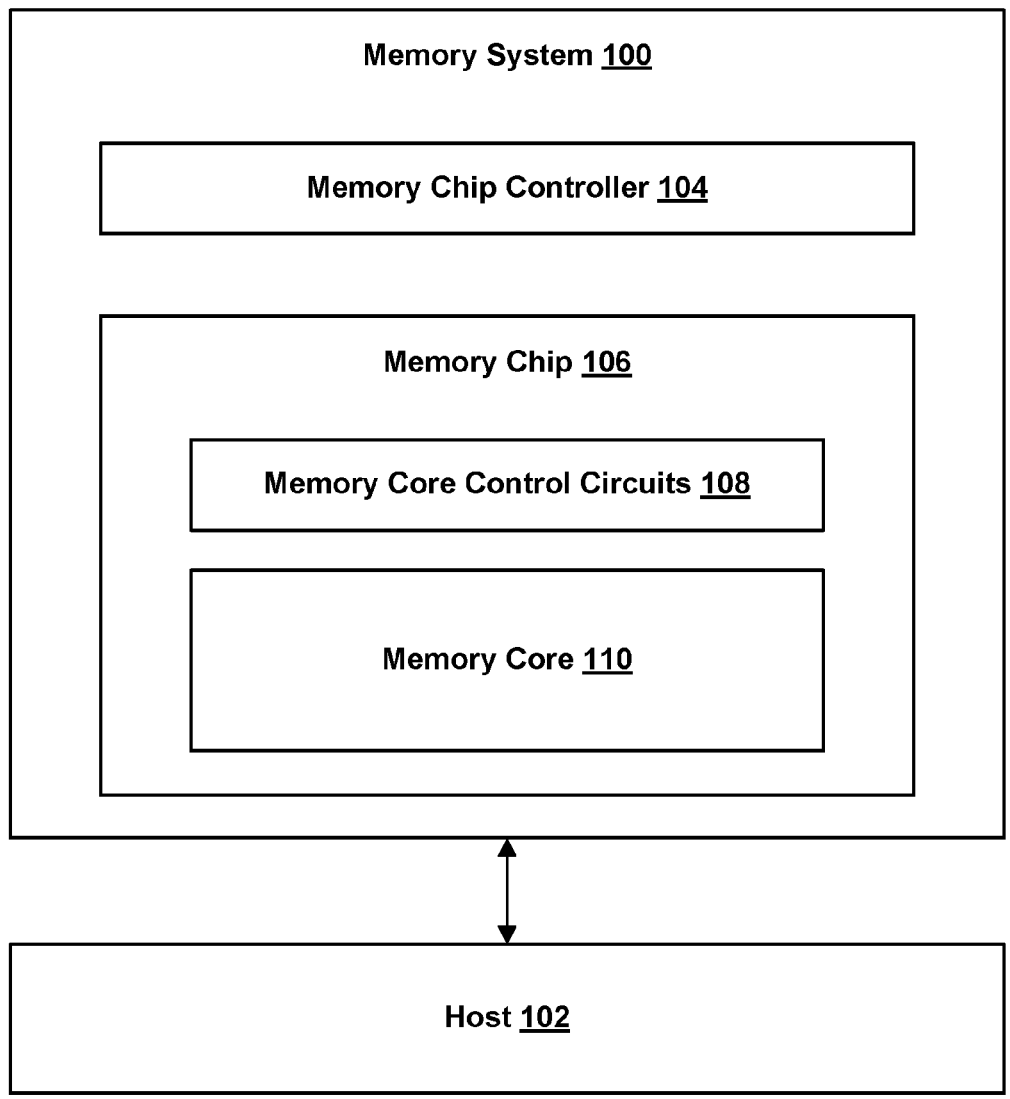
FIGS. 1A-1H depict various embodiments of a memory system.

FIG. 1A depicts one embodiment of a memory system 100 and a host 102. Memory system 100 may include a non-volatile storage system interfacing with host 102 (e.g., a mobile computing device or a server). In some cases, memory system 100 may be embedded within host 102. As examples, memory system 100 may be a memory card, a solid-state drive (SSD) such a high density MLC SSD (e.g., 2-bits/cell or 3-bits/cell) or a high performance SLC SSD, or a hybrid HDD/SSD drive.

As depicted, memory system 100 includes a memory chip controller 104 and a memory chip 106. Memory chip 106 may include volatile memory and/or non-volatile memory. Although a single memory chip is depicted, memory system 100 may include more than one memory chip. Memory chip controller 104 may receive data and commands from host 102 and provide memory chip data to host 102.

Memory chip controller 104 may include one or more state machines, page registers, SRAM, and control circuitry for controlling the operation of memory chip 106. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within memory chip 106. Memory chip controller 104 and memory chip 106 may be arranged on a single integrated circuit or arranged on a single die. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, and generating row and column addresses.

Memory core 110 may include one or more two-dimensional arrays of memory cells and/or one or more three-dimensional arrays of memory cells. In an embodiment, memory core control circuits 108 and memory core 110 may be arranged on a single integrated circuit. In other embodiments, memory core control circuits 108 (or a portion of memory core control circuits 108) and memory core 110 may be arranged on different integrated circuits.

A memory operation may be initiated when host 102 sends instructions to memory chip controller 104 indicating that host 102 would like to read data from memory system 100 or write data to memory system 100. In the event of a write (or programming) operation, host 102 may send to memory chip controller 104 both a write command and the data to be written. Memory chip controller 104 may buffer the data to be written and may generate error correction code (ECC) data corresponding with the data to be written. The ECC data, which allows data errors that occur during transmission or storage to be detected and/or corrected, may be written to memory core 110 or stored in non-volatile memory within memory chip controller 104. In an embodiment, the ECC data are generated and data errors are corrected by circuitry within memory chip controller 104.

Memory chip controller 104 may control operation of memory chip 106. In an example, before issuing a write operation to memory chip 106, memory chip controller 104 may check a status register to make sure that memory chip 106 is able to accept the data to be written. In another example, before issuing a read operation to memory chip 106, memory chip controller 104 may pre-read overhead information associated with the data to be read. The overhead information may include ECC data associated with the data to be read or a redirection pointer to a new memory location within memory chip 106 in which to read the data requested.

Once memory chip controller 104 initiates a read or write operation, memory core control circuits 108 may generate appropriate bias voltages for word lines and bit lines within memory core 110, as well as generate the appropriate memory block, row, and column addresses.

In some embodiments, one or more managing or control circuits may be used for controlling the operation of a memory array within memory core 110. The one or more managing or control circuits may provide control signals to a memory array to perform a read operation and/or a write operation on the memory array. In one example, the one or more managing or control circuits may include any one of or a combination of control circuitry, state machines, decoders, sense amplifiers, read/write circuits, and/or controllers.

The one or more managing circuits may perform or facilitate one or more memory array operations including erasing, programming, or reading operations. In one example, one or more managing circuits may include an on-chip memory controller for determining row and column address, word line and bit line addresses, memory array enable signals, and data latching signals.

Figure 1B:
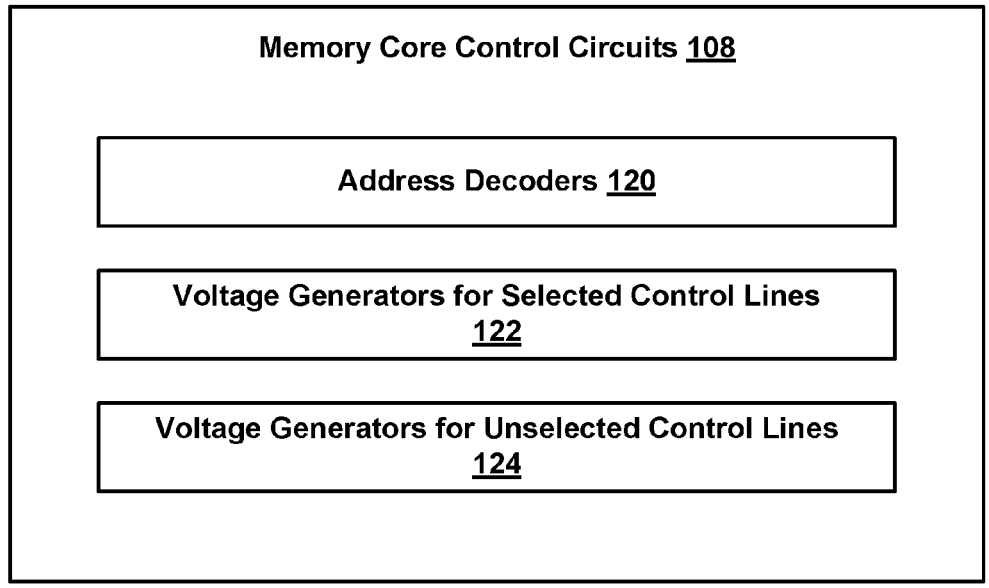

FIG. 1B depicts one embodiment of memory core control circuits 108. As depicted, memory core control circuits 108 include address decoders 120, voltage generators for selected control lines 122, and voltage generators for unselected control lines 124. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state.

Voltage generators (or voltage regulators) for selected control lines 122 may include one or more voltage generators for generating selected control line voltages. Voltage generators for unselected control lines 124 may include one or more voltage generators for generating unselected control line voltages. Address decoders 120 may generate memory block addresses, as well as row addresses and column addresses for a particular memory block.

FIGS. 1C-1F depict one embodiment of a memory core organization that includes a memory core 110 having multiple memory bays, and each memory bay having multiple memory blocks. Although a memory core organization is disclosed where memory bays include memory blocks, and memory blocks include a group of memory cells, other organizations or groupings also can be used with the technology described herein.

Figure 1C:
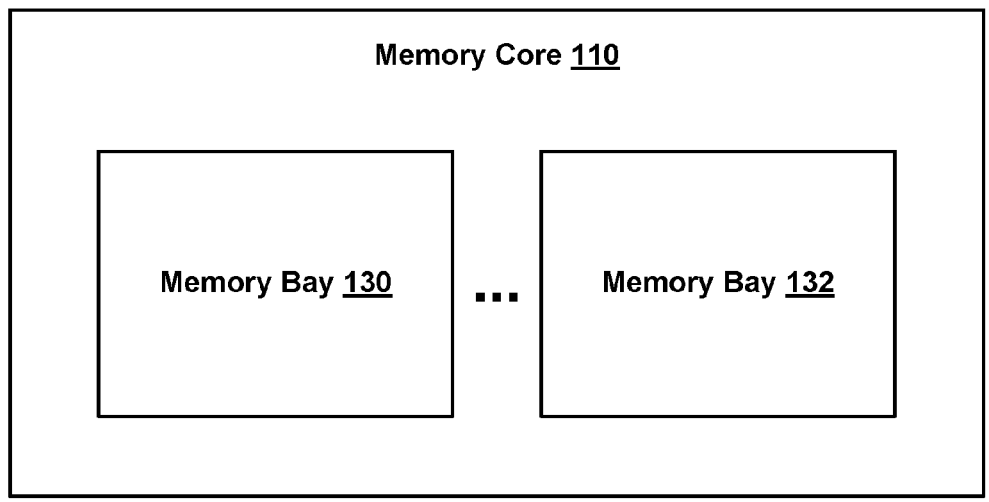

FIG. 1C depicts an embodiment of memory core 110 of FIG. 1A. As depicted, memory core 110 includes memory bay 130 and memory bay 132. In some embodiments, the number of memory bays per memory core can be different for different implementations. For example, a memory core may include only a single memory bay or multiple memory bays (e.g., 16 memory bays, 256 memory bays, etc.).

Figure 1D:
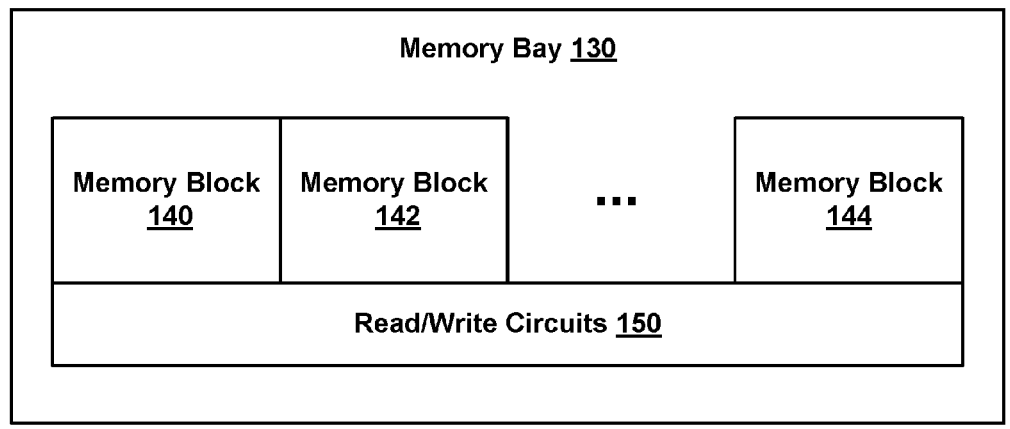

FIG. 1D depicts one embodiment of memory bay 130 of FIG. 1C. As depicted, memory bay 130 includes memory blocks 140-144 and read/write circuits 150. In some embodiments, the number of memory blocks per memory bay may be different for different implementations. For example, a memory bay may include one or more memory blocks (e.g., 32 memory blocks per memory bay).

Read/write circuits 150 include circuitry for reading and writing memory cells within memory blocks 140-144. As depicted, read/write circuits 150 may be shared across multiple memory blocks within a memory bay. This allows chip area to be reduced because a single group of read/write circuits 150 may be used to support multiple memory blocks. However, in some embodiments, only a single memory block may be electrically coupled to read/write circuits 150 at a particular time to avoid signal conflicts.

In some embodiments, read/write circuits 150 may be used to write one or more pages of data into memory blocks 140-144 (or into a subset of the memory blocks). The memory cells within memory blocks 140-144 may permit direct over-writing of pages (i.e., data representing a page or a portion of a page may be written into memory blocks 140-144 without requiring an erase or reset operation to be performed on the memory cells prior to writing the data).

In an example, memory system 100 of FIG. 1A may receive a write command including a target address and a set of data to be written to the target address. Memory system 100 may perform a read-before-write (RBW) operation to read the data currently stored at the target address before performing a write operation to write the set of data to the target address. Memory system 100 may then determine whether a particular memory cell may stay at its current state (i.e., the memory cell is already at the correct state), needs to be set to a "0" state, or needs to be reset to a "1" state.

Memory system 100 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells.

A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 150 may be used to program a particular memory cell to be in one of three or more data/resistance states (i.e., the particular memory cell may comprise a multi-level memory cell). In an example, read/write circuits 150 may apply a first voltage difference (e.g., 2V) across the particular memory cell to program the particular memory cell to a first state of the three or more data/resistance states, or a second voltage difference (e.g., 1V) across the particular memory cell that is less than the first voltage difference to program the particular memory cell to a second state of the three or more data/resistance states.

Applying a smaller voltage difference across the particular memory cell may cause the particular memory cell to be partially programmed or programmed at a slower rate than when applying a larger voltage difference. In another example, read/write circuits 150 may apply a first voltage difference across the particular memory cell for a first time period (e.g., 150 ns) to program the particular memory cell to a first state of the three or more data/resistance states, or apply the first voltage difference across the particular memory cell for a second time period less than the first time period (e.g., 50 ns). One or more programming pulses followed by a memory cell verification phase may be used to program the particular memory cell to be in the correct state.

Figure 1E:
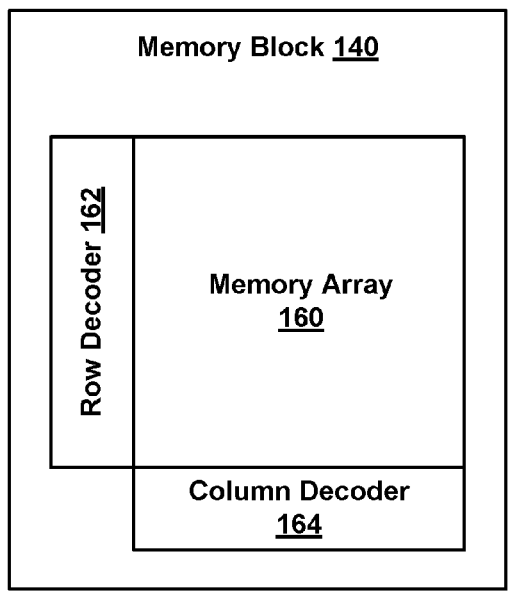

FIG. 1E depicts one embodiment of memory block 140 of FIG. 1D. As depicted, memory block 140 includes a memory array 160, a row decoder 162, and a column decoder 164. Memory array 160 may include a contiguous group of memory cells having contiguous word lines and bit lines. Memory array 160 may include one or more layers of memory cells, and may include a two-dimensional memory array and/or a three-dimensional memory array.

Row decoder 162 decodes a row address and selects a particular word line in memory array 160 when appropriate (e.g., when reading or writing memory cells in memory array 160). Column decoder 164 decodes a column address and selects a particular group of bit lines in memory array 160 to be electrically coupled to read/write circuits, such as read/write circuits 150 of FIG. 1D. In an embodiment, the number of word lines is 4K per memory layer, the number of bit lines is 1K per memory layer, and the number of memory layers is 4, providing a memory array 160 containing 16M memory cells. Other numbers of word lines per layer, bit lines per layer, and number of layers may be used.

Figure 1F:
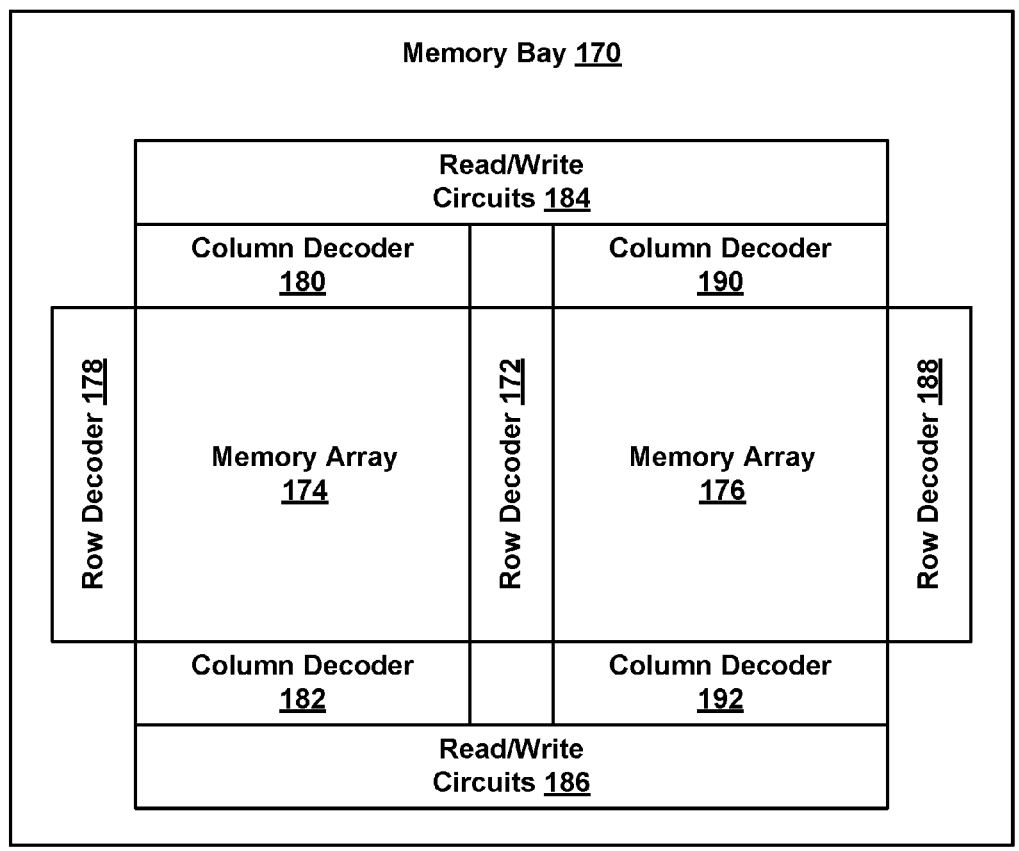

FIG. 1F depicts an embodiment of a memory bay 170. Memory bay 170 is an example of an alternative implementation for memory bay 130 of FIG. 1D. In some embodiments, row decoders, column decoders, and read/write circuits may be split or shared between memory arrays. As depicted, row decoder 172 is shared between memory arrays 174 and 176, because row decoder 172 controls word lines in both memory arrays 174 and 176 (i.e., the word lines driven by row decoder 172 are shared).

Row decoders 178 and 172 may be split such that even word lines in memory array 174 are driven by row decoder 178 and odd word lines in memory array 174 are driven by row decoder 172. Column decoders 180 and 182 may be split such that even bit lines in memory array 174 are controlled by column decoder 182 and odd bit lines in memory array 174 are driven by column decoder 180. The selected bit lines controlled by column decoder 180 may be electrically coupled to read/write circuits 184. The selected bit lines controlled by column decoder 182 may be electrically coupled to read/write circuits 186. Splitting the read/write circuits into read/write circuits 184 and 186 when the column decoders are split may allow for a more efficient layout of the memory bay.

Row decoders 188 and 172 may be split such that even word lines in memory array 176 are driven by row decoder 188 and odd word lines in memory array 176 are driven by row decoder 172. Column decoders 190 and 192 may be split such that even bit lines in memory array 176 are controlled by column decoder 192 and odd bit lines in memory array 176 are driven by column decoder 190. The selected bit lines controlled by column decoder 190 may be electrically coupled to read/write circuits 184. The selected bit lines controlled by column decoder 192 may be electrically coupled to read/write circuits 186. Splitting the read/write circuits into read/write circuits 184 and 186 when the column decoders are split may allow for a more efficient layout of the memory bay.

Figure 1G:
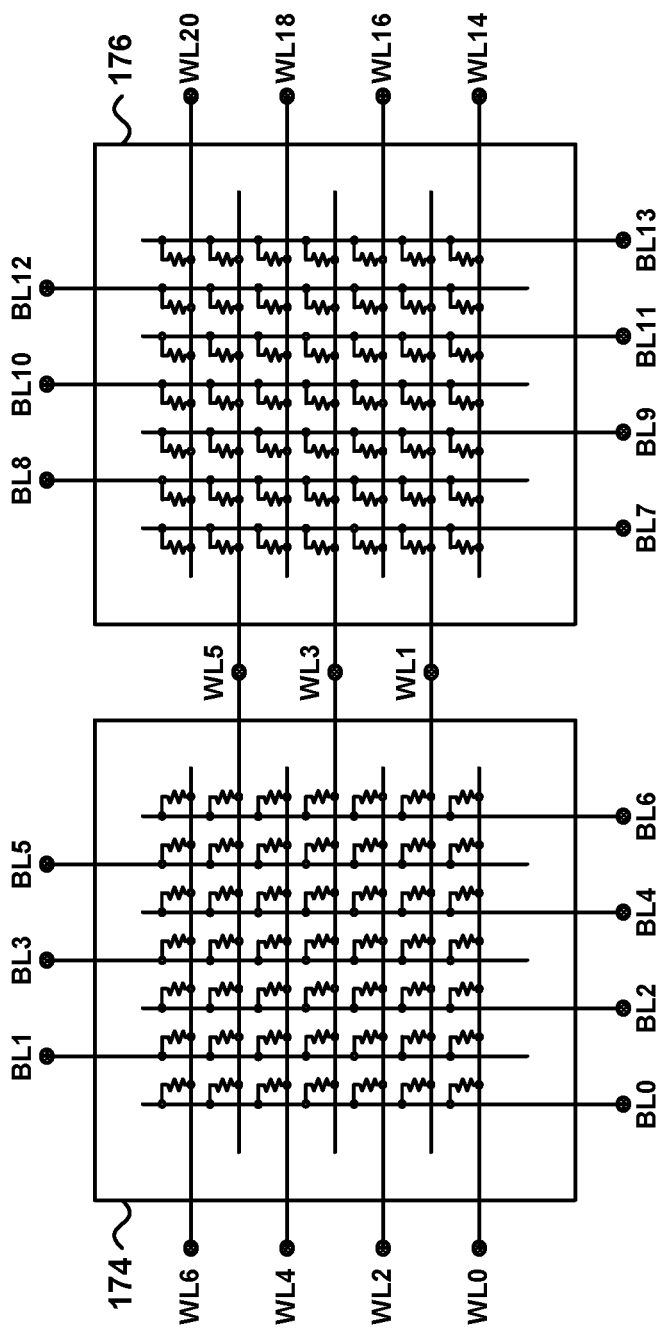

FIG. 1G depicts an embodiment of a schematic diagram (including word lines and bit lines) corresponding with memory bay 170 in FIG. 1F. As depicted, word lines WL1, WL3, and WL5 are shared between memory arrays 174 and 176 and controlled by row decoder 172 of FIG. 1F. Word lines WL0, WL2, WL4, and WL6 are driven from the left side of memory array 174 and controlled by row decoder 178 of FIG. 1F. Word lines WL14, WL16, WL18, and WL20 are driven from the right side of memory array 176 and controlled by row decoder 188 of FIG. 1F.

Bit lines BL0, BL2, BL4, and BL6 are driven from the bottom of memory array 174 and controlled by column decoder 182 of FIG. 1F. Bit lines BL1, BL3, and BL5 are driven from the top of memory array 174 and controlled by column decoder 180 of FIG. 1F. Bit lines BL7, BL9, BL11, and BL13 are driven from the bottom of memory array 176 and controlled by column decoder 192 of FIG. 1F. Bit lines BL8, BL10, and BL12 are driven from the top of memory array 176 and controlled by column decoder 190 of FIG. 1F.

In an embodiment, memory arrays 174 and 176 may include memory layers that are oriented in a plane that is horizontal to the supporting substrate. In another embodiment, memory arrays 174 and 176 may include memory layers that are oriented in a plane that is vertical with respect to the supporting substrate (i.e., the vertical plane is substantially perpendicular to the supporting substrate). In this case, the bit lines of the memory arrays may include substantially vertical bit lines.

Figure 1H:
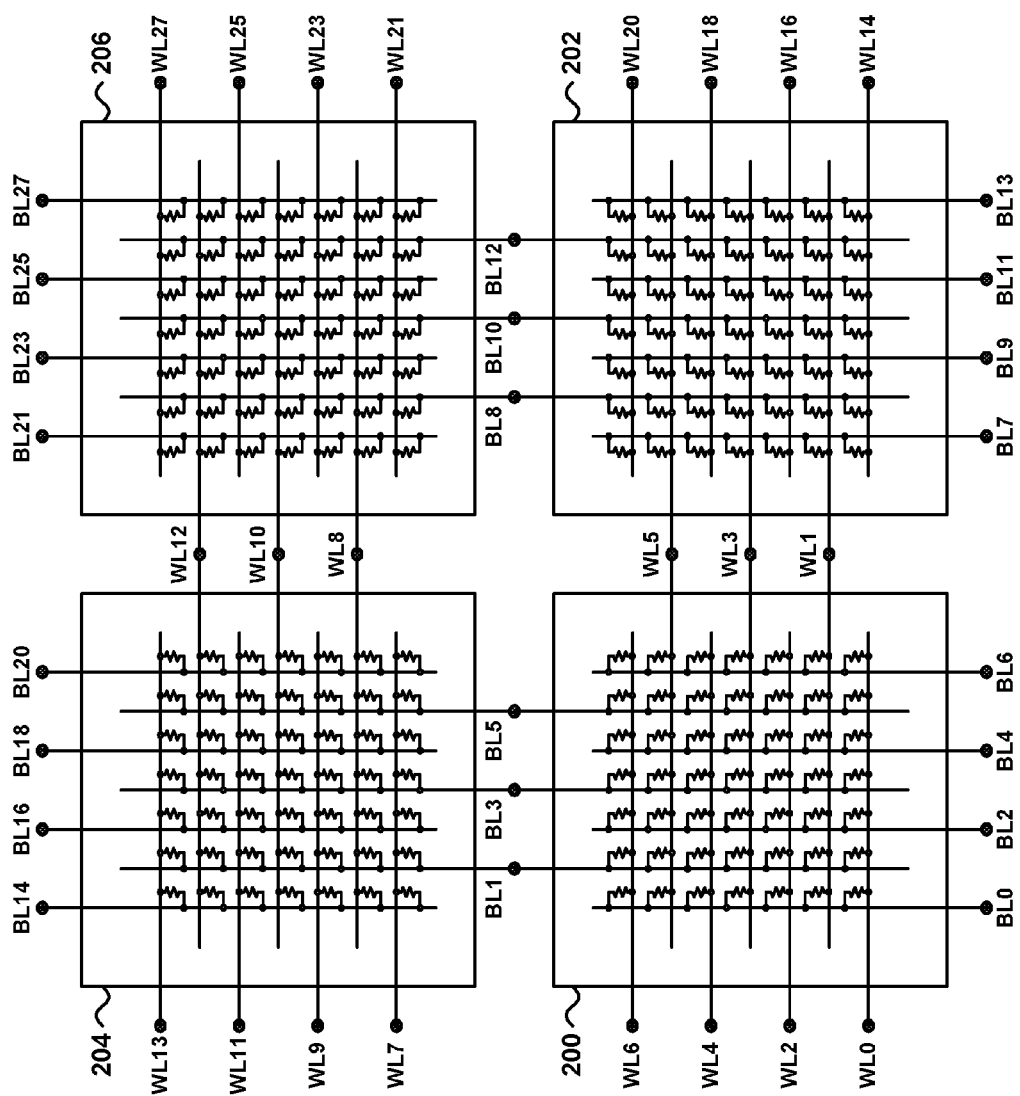

FIG. 1H depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area because a single row decoder and/or column decoder can be used to support two memory arrays.

As depicted, word lines WL1, WL3, and WL5 are shared between memory arrays 200 and 202. Bit lines BL1, BL3, and BL5 are shared between memory arrays 200 and 204. Word lines WL8, WL10, and WL12 are shared between memory arrays 204 and 206. Bit lines BL8, BL10, and BL12 are shared between memory arrays 202 and 206.

Row decoders are split such that word lines WL0, WL2, WL4, and WL6 are driven from the left side of memory array 200 and word lines WL1, WL3, and WL5 are driven from the right side of memory array 200. Likewise, word lines WL7, WL9, WL11, and WL13 are driven from the left side of memory array 204 and word lines WL8, WL10, and WL12 are driven from the right side of memory array 204.

Column decoders are split such that bit lines BL0, BL2, BL4, and BL6 are driven from the bottom of memory array 200 and bit lines BL1, BL3, and BL5 are driven from the top of memory array 200. Likewise, bit lines BL7, BL9, BL11, and BL13 are driven from the bottom of memory array 202 and bit lines BL8, BL10, and BL12 are driven from the top of memory array 202. Splitting row and/or column decoders also helps to relieve layout constraints (e.g., the column decoder pitch can be relieved by 2× since the split column decoders need only drive every other bit line instead of every bit line).

Figure 2:
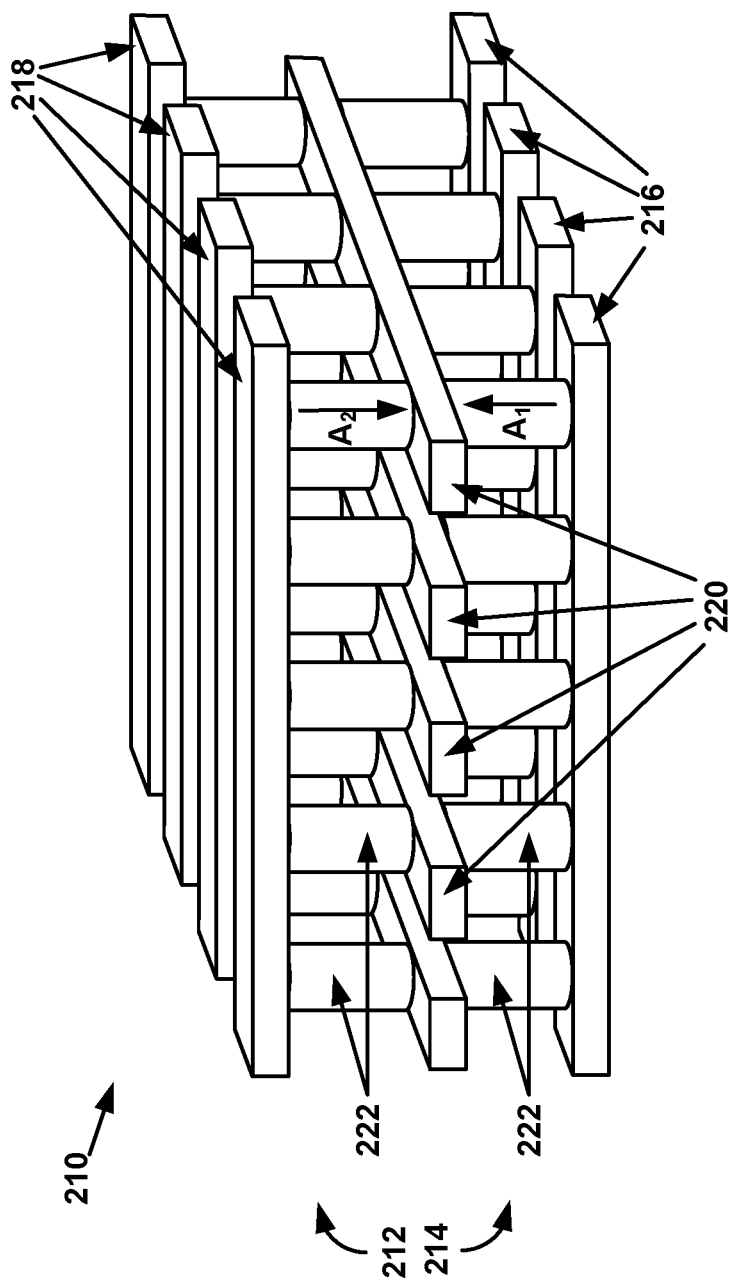
FIG. 2 depicts an embodiment of a portion of a three-dimensional memory array.

FIG. 2 depicts an embodiment of a portion of a monolithic three-dimensional memory array 210 that includes a second memory level 212 positioned above a first memory level 214. Memory array 210 is an example of an implementation of memory array 160 in FIG. 1E. Bit lines 216 and 218 are arranged in a first direction and word lines 220 are arranged in a second direction perpendicular to the first direction. As depicted, the upper conductors of first memory level 214 may be used as the lower conductors of second memory level 212. In a memory array with additional layers of memory cells, there would be corresponding additional layers of bit lines and word lines.

Memory array 210 includes a plurality of memory cells 222, each of which may include re-writeable memory cells. Memory cells 222 may include non-volatile memory cells or volatile memory cells. With respect to first memory level 214, a first portion of memory cells 222 are between and connect to bit lines 216 and word lines 220. With respect to second memory level 212, a second portion of memory cells 222 are between and connect to bit lines 218 and word lines 220.

In an embodiment, each memory cell 222 includes memory element (e.g., a state change element) coupled in series with a steering element. In an example, the steering elements are diodes. Diodes of first memory level 214 may be upward pointing diodes as indicated by arrow $A_1$ (e.g., with p regions at the bottom of the diodes), whereas diodes of second memory level 212 may be downward pointing diodes as indicated by arrow $A_2$ (e.g., with n regions at the bottom of the diodes), or vice versa.

In an embodiment, memory elements of memory cells 222 of FIG. 2 may include re-writable non-volatile memory cells including a reversible resistance-switching element. A reversible resistance-switching element may include a reversible resistivity-switching material having a resistivity that may be reversibly switched between two or more states. In an embodiment, the reversible resistance-switching material may include a metal oxide, solid electrolyte, phase-change material, magnetic material, or other similar resistivity-switching material. Various metal oxides can be used, such as transition metal-oxides. Examples of metal-oxides include, but are not limited to, NiO, $Nb_2O_5$, $TiO_2$, $HfO_2$, $Al_2O_3$, $MgO_x$, $CrO_2$, VO, BN, $TaO_2$, $Ta_2O_3$, and AlN.

In an embodiment of a read operation, data stored in one of the plurality of memory cells 222 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, to avoid sensing leakage current from the many unselected word lines to the selected bit line, the unselected word lines may be biased to the same voltage as the selected bit lines (e.g., 1.0V).

To avoid leakage current from the selected word line to the unselected bit lines, the unselected bit lines may be biased to the same voltage as the selected word line (e.g., 0V). However, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both unselected word lines and unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines.

However, the reduced voltage stress comes at the expense of increased leakage currents associated with the selected word line and the selected bit line. Before the selected word line voltage has been applied to the selected word line, the selected bit line voltage may be applied to the selected bit line. A read circuit may then sense an auto zero amount of current through the selected memory bit line, which is subtracted from the bit line current in a second current sensing when the selected word line voltage is applied to the selected word line. The leakage current may be subtracted out by using the auto zero current sensing.

In an embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state.

Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to include more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element.

The high-resistivity state may be associated with binary data "1" and the low-resistivity state may be associated with binary data "0." In other embodiments, SETTING and RESETTING operations and/or the data encoding may be reversed. For example, the high-resistivity state may be associated with binary data "0" and the low-resistivity state may be associated with binary data "1."

In some embodiments, a higher than normal programming voltage may be required the first time a reversible resistance-switching element is SET into the low-resistivity state as the reversible resistance-switching element may have been placed into a resistance state that is higher than the high-resistivity state when fabricated. The term "FORMING" may refer to the setting of a reversible resistance-switching element into a low-resistivity state for the first time after fabrication or the resetting of a reversible resistance-switching element into a high-resistivity state for the first time after fabrication. In some cases, after a FORMING operation or a memory cell preconditioning operation has been performed, the reversible resistance-switching element may be RESET to the high-resistivity state and then SET again to the low-resistivity state.

In an embodiment of a write operation, data may be written to one of the plurality of memory cells 222 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V).

In some cases, to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 3A:
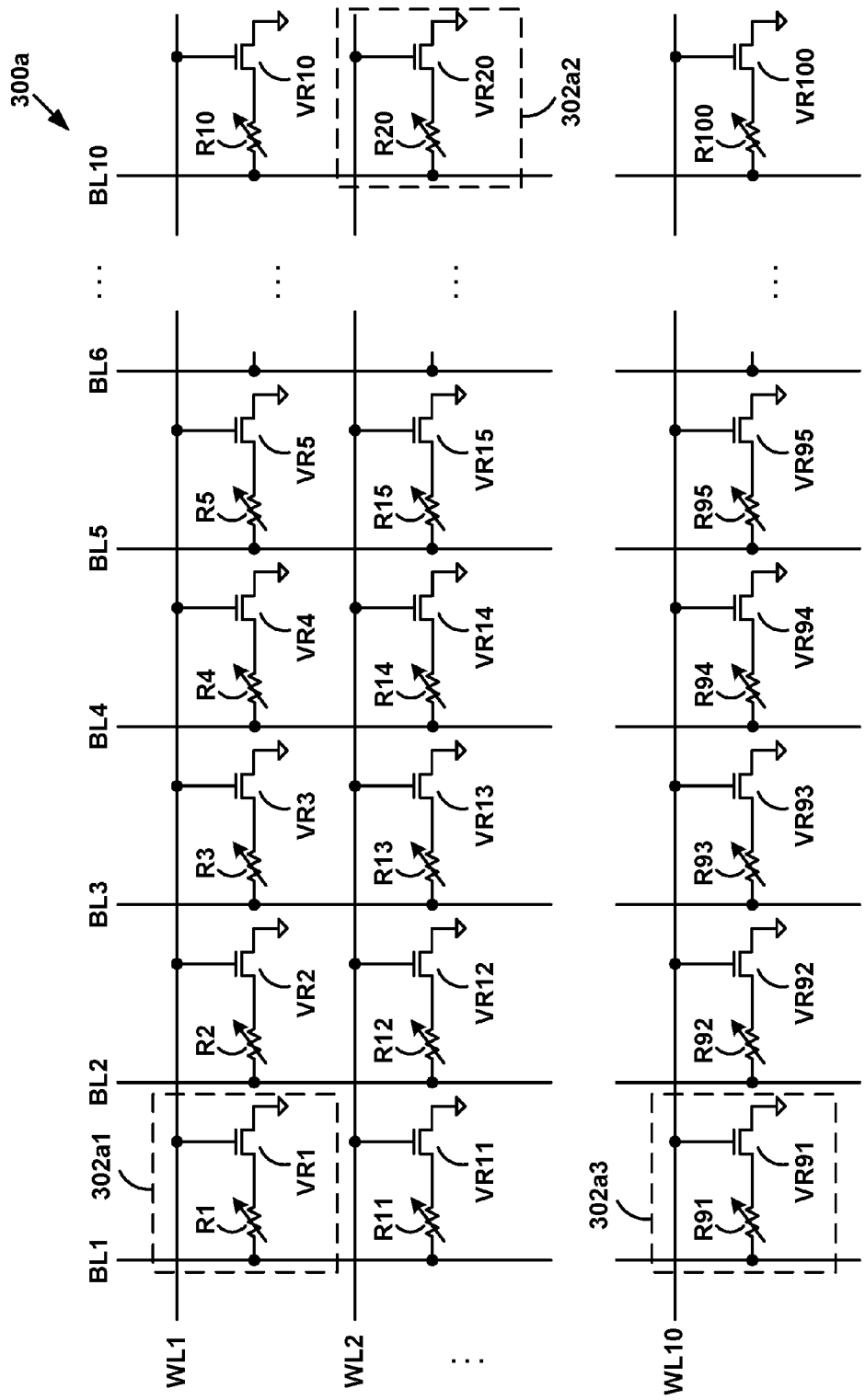
FIGS. 3A-3C depict embodiments of a cross-point memory array.

FIG. 3A is a simplified schematic diagram of an example cross-point memory array 300a, which includes word lines WL1, WL2, ..., WL10, bit lines BL1, BL2, ..., BL10, and memory cells 302a coupled to the word lines and the bit lines. Persons of ordinary skill in the art will understand that memory array 300a may include more or less than 10 word lines, more or less than 10 bit lines, and more or less than 100 memory cells 302a.

Each memory cell 302a is coupled to one of the word lines and one of the bit lines, and includes a corresponding reversible resistance-switching element R1, R2, ..., R100 coupled in series with a corresponding vertically-oriented adjustable resistance structure VR1, VR2, ..., VR100. In particular, each reversible resistance-switching element R1, R2, ..., R100 has a first terminal coupled to one of bit lines BL1, BL2, ..., BL10, and a second terminal coupled to a first terminal of a corresponding vertically-oriented adjustable resistance structure VR1, VR2, ..., VR100. Each vertically-oriented adjustable resistance structure VR1, VR2, ..., VR100 also includes a second terminal (also referred to herein as a gate terminal) coupled to one of word lines WL1, WL2, ..., WL10, and a third terminal coupled to a common potential (e.g., ground, virtual ground, or some other potential).

For example, memory cell 302a1 includes reversible resistance-switching element R1 and vertically-oriented adjustable resistance structure VR1. Reversible resistance-switching element R1 has a first terminal coupled to bit line BL1. Vertically-oriented adjustable resistance structure VR1 has a first terminal coupled to a second terminal of reversible resistance-switching element R1, a second terminal coupled to word line WL1, and a third terminal coupled to virtual ground.

Likewise, memory cell 302a2 includes reversible resistance-switching element R20 and vertically-oriented adjustable resistance structure VR20. Reversible resistance-switching element R20 has a first terminal coupled to bit line BL10. Vertically-oriented adjustable resistance structure VR20 has a first terminal coupled to a second terminal of reversible resistance-switching element R20, a second terminal coupled to word line WL2, and a third terminal coupled to virtual ground.

Similarly, memory cell 302a3 includes reversible resistance-switching element R91 and vertically-oriented adjustable resistance structure VR91. Reversible resistance-switching element R91 has a first terminal coupled to bit line BL1. Vertically-oriented adjustable resistance structure VR91 has a first terminal coupled to a second terminal of reversible resistance-switching element R91, a second terminal coupled to word line WL10, and a third terminal coupled to virtual ground.

Figure 3B:
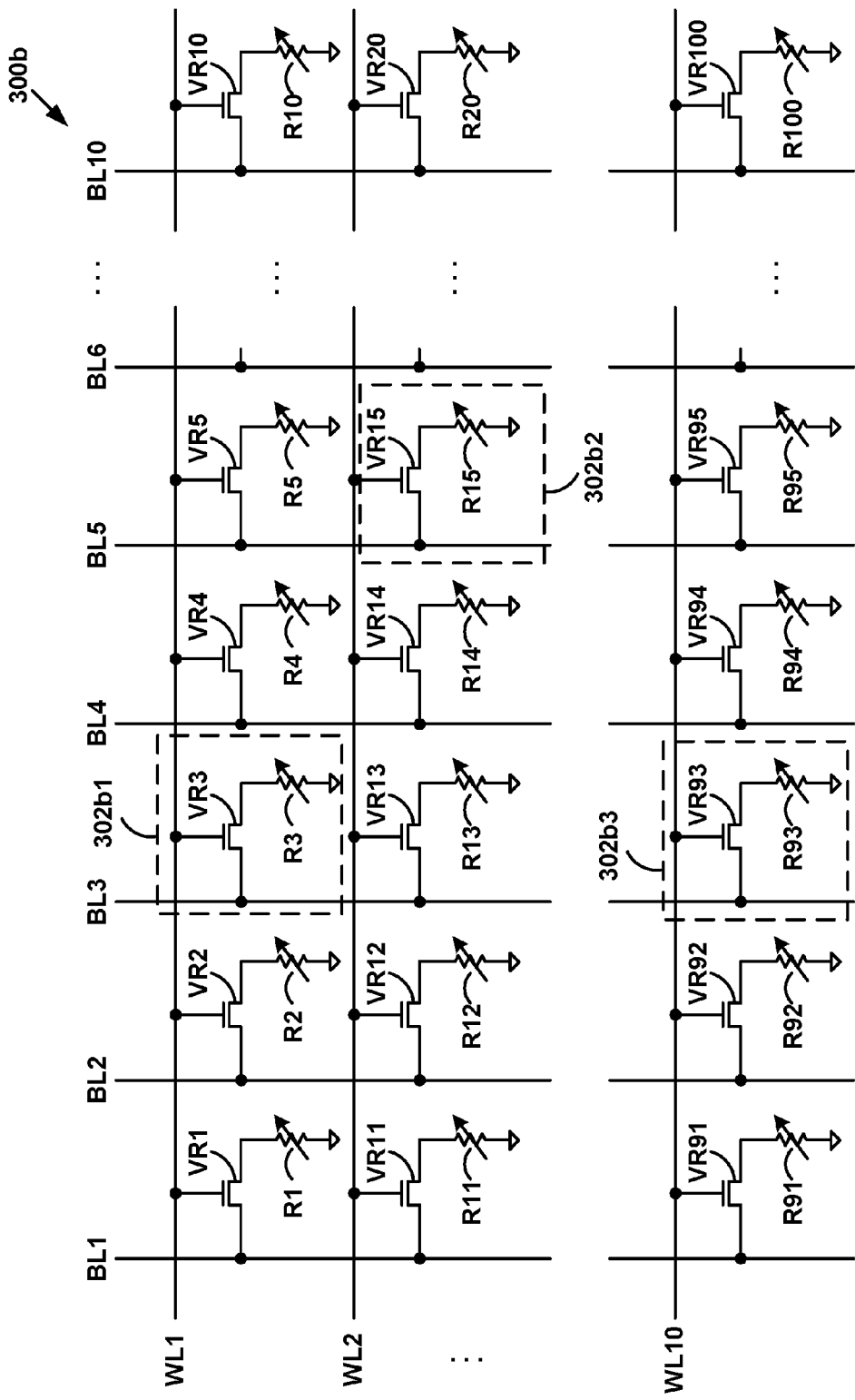

FIG. 3B is a simplified schematic diagram of an example cross-point memory array 300b, which includes word lines WL1, WL2, ..., WL10, bit lines BL1, BL2, ..., BL10, and memory cells 302b coupled to the word lines and the bit lines. Persons of ordinary skill in the art will understand that memory array 300b may include more or less than 10 word lines, more or less than 10 bit lines, and more or less than 100 memory cells 302b.

Each memory cell 302b is coupled to one of the word lines and one of the bit lines, and includes a corresponding vertically-oriented adjustable resistance structure VR1, VR2, ..., VR100 coupled in series with a corresponding reversible resistance-switching element R1, R2, ..., R100. In particular, each vertically-oriented adjustable resistance structure VR1, VR2, ..., VR100 has a first terminal coupled to one of bit lines BL1, BL2, ..., BL10, a second terminal (also referred to herein as a gate terminal) coupled to one of word lines WL1, WL2, ..., WL10, and a third terminal coupled to a first terminal of a corresponding reversible resistance-switching element R1, R2, ..., R100. Each reversible resistance-switching element R1, R2, ..., R100 also includes a second terminal coupled to a common potential (e.g., ground, virtual ground, or some other potential).

For example, memory cell 302b1 includes vertically-oriented adjustable resistance structure VR3 and reversible resistance-switching element R3. Vertically-oriented adjustable resistance structure VR3 has a first terminal coupled to bit line BL3, a second terminal coupled to word line WL1, and a third terminal coupled to a first terminal of reversible resistance-switching element R3. Reversible resistance-switching element R3 has a second terminal coupled to virtual ground.

Likewise, memory cell 302b2 includes vertically-oriented adjustable resistance structure VR15 and reversible resistance-switching element R15. Vertically-oriented adjustable resistance structure VR15 has a first terminal coupled to bit line BL5, a second terminal coupled to word line WL2, and a third terminal coupled to a first terminal of reversible resistance-switching element R15. Reversible resistance-switching element R15 has a second terminal coupled to virtual ground.

Similarly, memory cell 302b3 includes vertically-oriented adjustable resistance structure VR93 and reversible resistance-switching element R93. Vertically-oriented adjustable resistance structure VR93 has a first terminal coupled to bit line BL3, a second terminal coupled to word line WL10, and a third terminal coupled to a first terminal of reversible resistance-switching element R93. Reversible resistance-switching element R93 has a second terminal coupled to virtual ground.

Figure 3C:
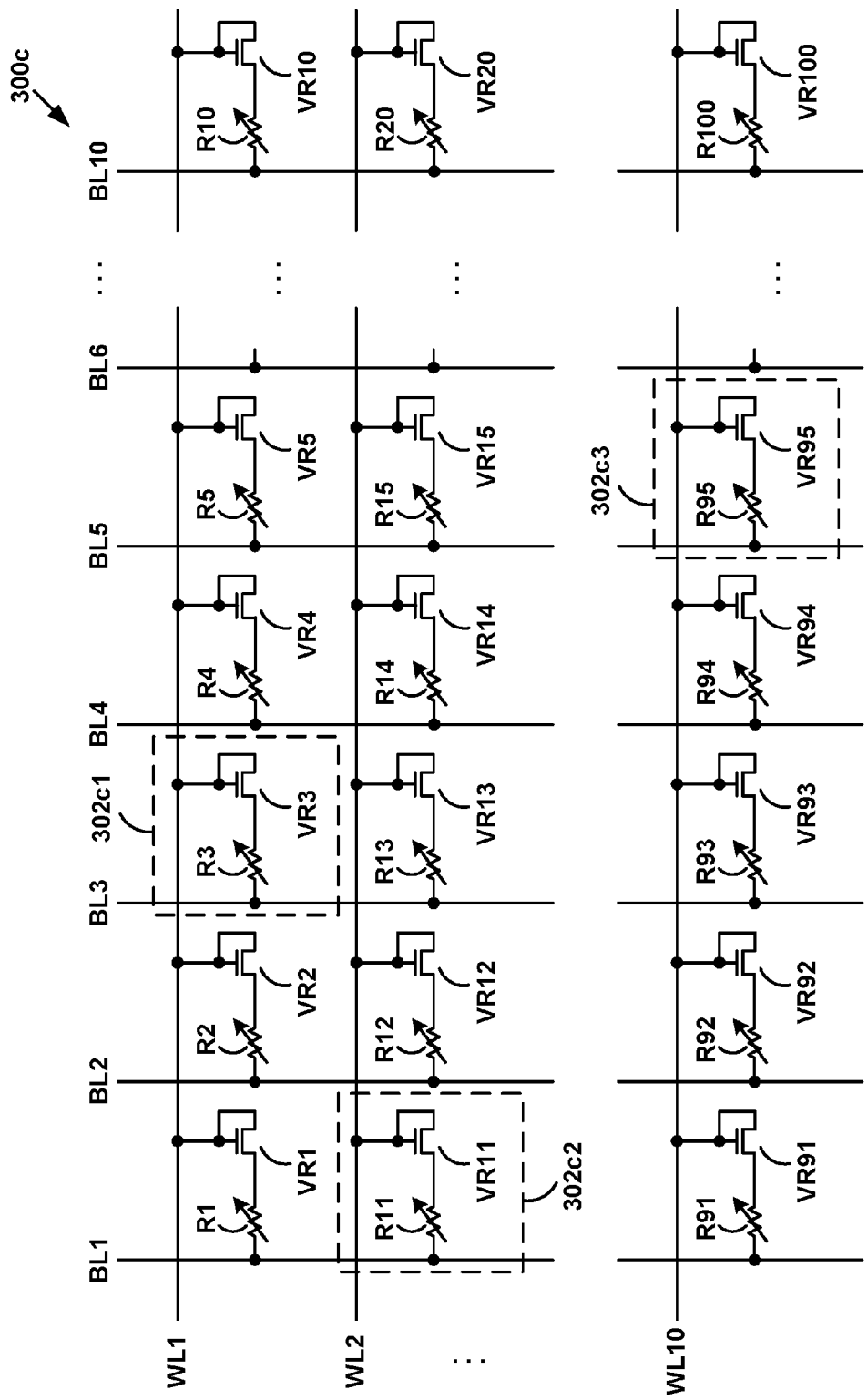

FIG. 3C is a simplified schematic diagram of an example cross-point memory array 300c, which includes word lines WL1, WL2, ..., WL10, bit lines BL1, BL2, ..., BL10, and memory cells 302c coupled to the word lines and the bit lines. Persons of ordinary skill in the art will understand that memory array 300c may include more or less than 10 word lines, more or less than 10 bit lines, and more or less than 100 memory cells 302c.

Each memory cell 302c is coupled to one of the word lines and one of the bit lines, and includes a corresponding reversible resistance-switching element R1, R2, ..., R100 coupled in series with a corresponding vertically-oriented adjustable resistance structure VR1, VR2, ..., VR100. In particular, each reversible resistance-switching element R1, R2, ..., R100 has a first terminal coupled to one of bit lines BL1, BL2, ..., BL10, and a second terminal coupled to a first terminal of a corresponding vertically-oriented adjustable resistance structure VR1, VR2, ..., VR100. Each vertically-oriented adjustable resistance structure VR1, VR2, ..., VR100 also includes a second terminal (also referred to herein as a gate terminal) coupled to one of word lines WL1, WL2, ..., WL10, and a third terminal coupled to a the gate terminal.

For example, memory cell 302c1 includes reversible resistance-switching element R3 and vertically-oriented adjustable resistance structure VR3. Reversible resistance-switching element R3 has a first terminal coupled to bit line BL3. Vertically-oriented adjustable resistance structure VR1 has a first terminal coupled to a second terminal of reversible resistance-switching element R3, and second and third terminals coupled to word line WL1.

Likewise, memory cell 302c2 includes reversible resistance-switching element R11 and vertically-oriented adjustable resistance structure VR11. Reversible resistance-switching element R11 has a first terminal coupled to bit line BL1. Vertically-oriented adjustable resistance structure VR20 has a first terminal coupled to a second terminal of reversible resistance-switching element R11, and second and third terminals coupled to word line WL2.

Similarly, memory cell 302c3 includes reversible resistance-switching element R95 and vertically-oriented adjustable resistance structure VR95. Reversible resistance-switching element R95 has a first terminal coupled to bit line BL5. Vertically-oriented adjustable resistance structure VR95 has a first terminal coupled to a second terminal of reversible resistance-switching element R95, and second and third terminals coupled to word line WL10.

Figure 4A:
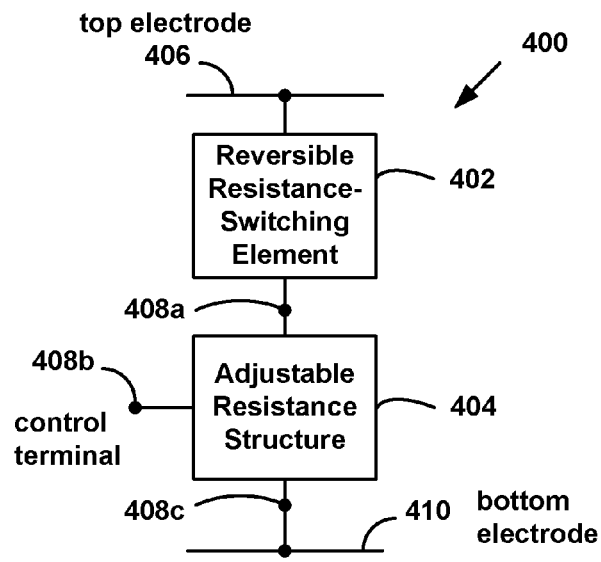
FIG. 4A depicts a block diagram of an embodiment of a memory cell including an adjustable resistance structure.

FIG. 4A is a simplified block diagram of an example memory cell 400 that includes a reversible resistance-switching element 402 coupled to a vertically-oriented adjustable resistance structure 404. Reversible resistance-switching element 402 has a first terminal coupled to a top electrode 406. Vertically-oriented adjustable resistance structure 404 includes a first terminal 408a coupled to a second terminal of reversible resistance-switching element 402, a second (control) terminal 408b, and a third terminal 408c coupled to bottom electrode 410.

In operation, control terminal 408b may be used to adjust the resistance of vertically-oriented adjustable resistance structure 404. In particular, vertically-oriented adjustable resistance structure 404 may be set to a low resistance or a high resistance based on a voltage applied to control terminal 408b.

In an embodiment, application of a first voltage to control terminal 408b sets vertically-oriented adjustable resistance structure 404 to a first resistance, and application of a second voltage to control terminal 408b sets vertically-oriented adjustable resistance structure 404 to a second resistance. In an embodiment, the first voltage may be between about 1V and about 5V above the lower of the voltages on terminals 408a and 408c, and the second voltage may be between about 0V and about 1V above the lower of the voltages on terminals 408a and 408c, although other voltages may be used. In an embodiment, the first resistance may be a low resistance, and the second resistance may be a high-resistance.

In operation, application of the first voltage to control terminal 408b forms a low resistance path (e.g., less than about 100 kΩ) between first terminal 408a and third terminal 408c of vertically-oriented adjustable resistance structure 404. Application of the second voltage to control terminal 408b forms a high resistance path (e.g., greater than about 10 MΩ) between first terminal 408a and third terminal 408c of vertically-oriented adjustable resistance structure 404. In this regard, vertically-oriented adjustable resistance structure 404 functions as a steering element that may be used to selectively couple reversible resistance-switching element 402 to bottom electrode 410.

Memory cell 400 may be configured as memory cells 302a of FIG. 3A, with top electrode 406 coupled to one of bit lines BL1, BL2, ..., BL10, bottom electrode 410 coupled to a common potential, and control terminal 408b coupled to one of word lines WL1, WL2, ..., WL10. Likewise, memory cell 400 may be configured as memory cells 302b of FIG. 3B, with top electrode 406 coupled to a common potential, bottom electrode 410 coupled to one of bit lines BL1, BL2, ..., BL10, and control terminal 408b coupled to one of word lines WL1, WL2, ..., WL10.

Figure 4B:
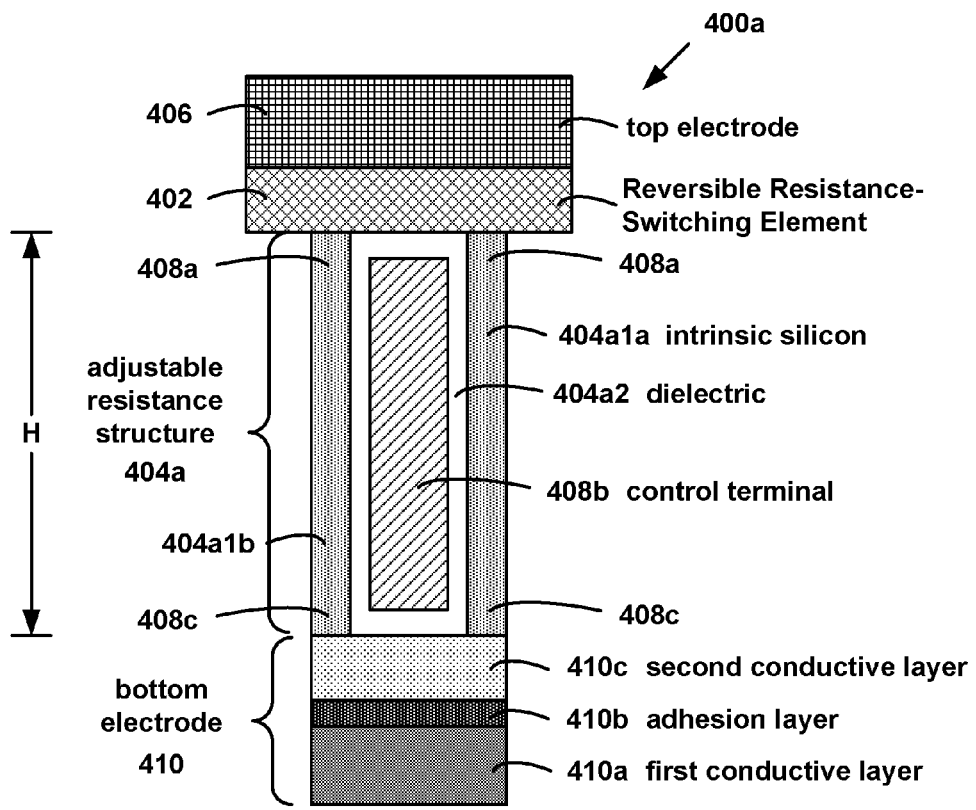

FIG. 4B is a cross-sectional diagram of a memory cell 400a, which is an example implementation of memory cell 400 of FIG. 4A. Memory cell 400a includes reversible resistance-switching element 402, vertically-oriented adjustable resistance structure 404a, top electrode 406 and bottom electrode 410. As described in more detail below, vertically-oriented adjustable resistance structure 404a functions as a steering element that may be used to selectively couple reversible resistance-switching element 402 to bottom electrode 410.

Bottom electrode 410 includes a first conductive layer 410a, an optional adhesion layer 410b above first conductive layer 410a, and a second conductive layer 410c above optional adhesion layer 410b. First conductive layer 410a may be formed from any suitable conductive material such as a metal (e.g., tungsten), heavily doped semiconductor material, a conductive silicide, a conductive silicide-germanide, a conductive germanide, or the like deposited by physical vapor deposition (PVD) or any suitable method (e.g., chemical vapor deposition (CVD), etc.). Other conductive layer materials may be used. First conductive layer 410a may be between about 1000 angstroms and about 5000 angstroms, although other thicknesses may be used.

Adhesion layer 410b may include titanium nitride or another suitable layer such as tantalum nitride, tungsten nitride, tungsten, molybdenum, combinations of one or more layers, or any other suitable material(s). Adhesion layer 410b may be deposited by PVD or any other any suitable method. Adhesion layer 410b may be between about 70 angstroms and about 500 angstroms, although other thicknesses may be used.

Second conductive layer 410c may be highly doped polysilicon. In an embodiment, second conductive layer 410c includes n+ polysilicon having a carrier concentration between about $10^{19}$ carriers/cm$^3$ and about $10^{21}$ carriers/cm$^3$ at room temperature. Second conductive layer 410c may be deposited by CVD or any other any suitable method. Second conductive layer 410c may be between about 100 angstroms and about 1000 angstroms, although other thicknesses may be used.

Vertically-oriented adjustable resistance structure 404a is disposed over second conductive layer 410c, and includes vertically-oriented adjustable resistance material layers 404a1a and 404a1b and dielectric material layer 404a2 disposed adjacent second (control) terminal 408b. Vertically-oriented adjustable resistance structure 404a includes a first terminal 408a adjacent reversible resistance-switching element 402, and a third terminal 408c adjacent second conductive layer 410c. In an embodiment, vertically-oriented adjustable resistance structure 404a has a height H of between about 1500 angstroms and about 5000 angstroms, although other heights may be used.

In an embodiment, vertically-oriented adjustable resistance material layers 404a1a and 404a1b each have a long axis that is arranged in a direction that is substantially orthogonal to a substrate. In this regard, vertically-oriented adjustable resistance structure 404a may be a vertically-oriented pillar that is orthogonal to a silicon substrate. In some embodiments, vertically-oriented adjustable resistance structure 404a may be a rectangular pillar or a cylindrical pillar, although other pillar shapes may be used.

Vertically-oriented adjustable resistance material layers 404a1a and 404a1b may be intrinsic or undoped polycrystalline silicon (or polysilicon), undoped silicon germanium, or indium gallium arsenide. In an embodiment, the carrier concentration of the polycrystalline silicon may be between about $10^{15}$ carriers/cm$^3$ and about $5 \times 10^{17}$ carriers/cm$^3$ at room temperature. Vertically-oriented adjustable resistance material layers 404a1a and 404a1b may be deposited by CVD or any suitable method. In an embodiment, vertically-oriented adjustable resistance layers 404a1a and 404a1b may be between about 50 angstroms and about 250 angstroms thick, although other thicknesses may be used.

Dielectric material layer 404a2 is disposed between and isolates control terminal 408b from vertically-oriented adjustable resistance material layers 404a1a and 404a1b. Dielectric material layer 404a2 may be an oxide layer, such as silicon dioxide, hafnium dioxide, or other similar oxide layer, or a nitride layer, such as silicon nitride. Dielectric material layer 404a2 may be deposited by CVD or any suitable method. Dielectric material layer 404a2 may have a thickness between about 20 angstroms and about 100 angstroms, although other thicknesses may be used.

Control terminal 408b may include a conductive material, such as a metal (e.g., tungsten), metal nitride (e.g., TiN), highly doped polysilicon (e.g., n+ polysilicon), or other conductive material. Control terminal 408b may be deposited by PVD, CVD or any suitable method. Control terminal 408b may have a thickness between about 80 angstroms and about 500 angstroms, although other thicknesses may be used.

Reversible resistance-switching element 402 is disposed above vertically-oriented adjustable resistance structure 404a, and may include a metal oxide, solid electrolyte, phase-change material, magnetic material, or other similar resistivity-switching material. Various metal oxides can be used, such as transition metal-oxides. Examples of metal-oxides include, but are not limited to, NiO, $Nb_2O_5$, $TiO_2$, $HfO_2$, $Al_2O_3$, $MgO_x$, $CrO_2$, VO, BN, $TaO_2$, $Ta_2O_3$, and AlN. Reversible resistance-switching element 402 may deposited by PVD, CVD, or any suitable method. Reversible resistance-switching element 402 may have a thickness between about 8 angstroms and about 80 angstroms, although other thicknesses may be used.

Top electrode 406 is disposed above reversible resistance-switching element 402, and may be formed from any suitable conductive material such as tungsten, another suitable metal, heavily doped semiconductor material, a conductive silicide, a conductive silicide-germanide, a conductive germanide, or the like deposited by PVD, CVD or any suitable method. Other conductive layer materials may be used. Top electrode 406 may be between about 200 angstroms and about 3000 angstroms, although other thicknesses may be used.

In operation, control terminal 408b may be used to adjust the resistance of vertically-oriented adjustable resistance material layers 404a1a and 404a1b. In particular, vertically-oriented adjustable resistance material layers 404a1a and 404a1b may be set to a low resistance or a high resistance based on a voltage applied to control terminal 408b. In operation, applying a voltage to control terminal 408b may cause vertically-oriented adjustable resistance material layers 404a1a and 404a1b to become fully depleted of majority charge carriers.

In an embodiment, application of a first voltage to control terminal 408b sets vertically-oriented adjustable resistance material layers 404a1a and 404a1b to a first resistance, and application of a second voltage to control terminal 408b sets vertically-oriented adjustable resistance material layers 404a1a and 404a1b to a second resistance. In an embodiment, the first voltage may be between about 1V and about 5V above the lower of the voltages on terminals 408a and 408c, and the second voltage may be between about 0V and about 1V above the lower of the voltages on terminals 408a and 408c, although other voltages may be used. In an embodiment, the first resistance may be a low resistance, and the second resistance may be a high-resistance.

In operation, application of the first voltage to control terminal 408b forms a low resistance path (e.g., less than about 100 kΩ) between first terminal 408a and third terminal 408c of vertically-oriented adjustable resistance structure 404a. Application of the second voltage to control terminal 408b forms a high resistance path (e.g., greater than about 10 MΩ) between first terminal 408a and third terminal 408c of vertically-oriented adjustable resistance structure 404a. In this regard, vertically-oriented adjustable resistance structure 404a functions as a steering element that may be used to selectively couple reversible resistance-switching element 402 to bottom electrode 410.

In memory cell 400a, vertically-oriented adjustable resistance structure 404a includes two separate vertically-oriented adjustable resistance material layers 404a1a and 404a1b. In other embodiments, vertically-oriented adjustable resistance structures may include more or less than two vertically-oriented adjustable resistance material layers.

For example, FIG. 4C is a cross-sectional diagram of a memory cell 400b, which is another example implementation of memory cell 400 of FIG. 4A. Memory cell 400b includes reversible resistance-switching element 402, vertically-oriented adjustable resistance structure 404b, top electrode 406 and bottom electrode 410. As described in more detail below, vertically-oriented adjustable resistance structure 404b functions as a steering element that may be used to selectively couple reversible resistance-switching element 402 to bottom electrode 410.

Vertically-oriented adjustable resistance structure 404b includes vertically-oriented adjustable resistance material layer 404b1 and dielectric material layer 404b2 disposed adjacent second (control) terminal 408b. Vertically-oriented adjustable resistance structure 404b includes a first terminal 408a adjacent reversible resistance-switching element 402, and a third terminal 408c adjacent second conductive layer 410c. In an embodiment, vertically-oriented adjustable resistance structure 404b has a height H of between about 1500 angstroms and about 5000 angstroms, although other heights may be used.

In an embodiment, vertically-oriented adjustable resistance material layer 404b1 is a U-shaped structure having legs arranged in a direction that is substantially orthogonal to a substrate. In this regard, vertically-oriented adjustable resistance structure 404b may be a vertically-oriented pillar that is orthogonal to a silicon substrate. In some embodiments, vertically-oriented adjustable resistance structure 404b may be a rectangular pillar or a cylindrical pillar, although other pillar shapes may be used.

Vertically-oriented adjustable resistance material layer 404b1 may be intrinsic or undoped polycrystalline silicon (or polysilicon), undoped silicon germanium, or indium gallium arsenide. In an embodiment, the carrier concentration of the polycrystalline silicon may be between about $10^{15}$ carriers/cm$^3$ and about $5\times10^{17}$ carriers/cm$^3$ at room temperature. Vertically-oriented adjustable resistance material layer 404b1 may be deposited by CVD or any suitable method. In an embodiment, vertically-oriented adjustable resistance layer 404b1 may be between about 50 angstroms and about 250 angstroms thick, although other thicknesses may be used.

Dielectric material layer 404b2 is disposed between and isolates control terminal 408b from vertically-oriented adjustable resistance material layer 404b1. Dielectric material layer 404b2 may be an oxide layer, such as silicon dioxide, hafnium dioxide, or other similar oxide layer, or a nitride layer, such as silicon nitride. Dielectric material layer 404b2 may be deposited by CVD or any suitable method. Dielectric material layer 404b2 may have a thickness between about 20 angstroms and about 100 angstroms, although other thicknesses may be used.

In operation, control terminal 408b may be used to adjust the resistance of vertically-oriented adjustable resistance material layer 404b1. In particular, vertically-oriented adjustable resistance material layer 404b1 may be set to a low resistance or a high resistance based on a voltage applied to control terminal 408b. In operation, applying a voltage to control terminal 408b may cause vertically-oriented adjustable resistance material layers 404b1 to become fully depleted of majority charge carriers.

In an embodiment, application of a first voltage to control terminal 408b sets vertically-oriented adjustable resistance material layer 404b1 to a first resistance, and application of a second voltage to control terminal 408b sets vertically-oriented adjustable resistance material layers 404b1 to a second resistance. In an embodiment, the first voltage may be between about 1V and about 5V above the lower of the voltages on terminals 408a and 408c, and the second voltage may be between about 0V and about 1V above the lower of the voltages on terminals 408a and 408c, although other voltages may be used. In an embodiment, the first resistance may be a low resistance, and the second resistance may be a high-resistance.

In operation, application of the first voltage to control terminal 408b forms a low resistance path (e.g., less than about 100 kΩ) between first terminal 408a and third terminal 408c of vertically-oriented adjustable resistance structure 404b. Application of the second voltage to control terminal 408b forms a high resistance path (e.g., greater than about 10 MΩ) between first terminal 408a and third terminal 408c of vertically-oriented adjustable resistance structure 404b. In this regard, vertically-oriented adjustable resistance structure 404b functions as a steering element that may be used to selectively couple reversible resistance-switching element 402 to bottom electrode 410.

FIG. 4D is a cross-sectional diagram of a memory cell 400c, which is another example implementation of memory cell 400 of FIG. 4A. Memory cell 400c includes reversible resistance-switching element 402, vertically-oriented adjustable resistance structure 404c, top electrode 406 and bottom electrode 410. As described in more detail below, vertically-oriented adjustable resistance structure 404c functions as a steering element that may be used to selectively couple reversible resistance-switching element 402 to bottom electrode 410.

Vertically-oriented adjustable resistance structure 404c includes vertically-oriented adjustable resistance material layer 404c1 and dielectric material layer 404c2 disposed adjacent second (control) terminal 408b. Vertically-oriented adjustable resistance structure 404c includes a first terminal 408a adjacent reversible resistance-switching element 402, and a third terminal 408c adjacent second conductive layer 410c. In an embodiment, vertically-oriented adjustable resistance structure 404c has a height H of between about 1500 angstroms and about 5000 angstroms, although other heights may be used.

In an embodiment, vertically-oriented adjustable resistance material layer 404c1 is a rectangular structure having a long axis arranged in a direction that is substantially orthogonal to a substrate. In this regard, vertically-oriented adjustable resistance structure 404c may be a vertically-oriented pillar that is orthogonal to a silicon substrate. In some embodiments, vertically-oriented adjustable resistance structure 404c may be a rectangular pillar or a cylindrical pillar, although other pillar shapes may be used.

Vertically-oriented adjustable resistance material layer 404c1 may be intrinsic or undoped polycrystalline silicon (or polysilicon), undoped silicon germanium, or indium gallium arsenide. In an embodiment, the carrier concentration of the polycrystalline silicon may be between about $10^{15}$ carriers/cm$^3$ and about $5\times10^{17}$ carriers/cm$^3$ at room temperature. Vertically-oriented adjustable resistance material layer 404c1 may be deposited by CVD or any suitable method. In an embodiment, vertically-oriented adjustable resistance layer 404c1 may be between about 50 angstroms and about 250 angstroms thick, although other thicknesses may be used.

Dielectric material layer 404c2 is disposed between and isolates control terminal 408b from adjustable resistance material layer 404c1. Dielectric material layer 404c2 may be an oxide layer, such as silicon dioxide, hafnium dioxide, or other similar oxide layer, or a nitride layer, such as silicon nitride. Dielectric material layer 404c2 may be deposited by CVD or any suitable method. Dielectric material layer 404c2 may have a thickness between about 20 angstroms and about 100 angstroms, although other thicknesses may be used.

In operation, control terminal 408b may be used to adjust the resistance of vertically-oriented adjustable resistance material layer 404c1. In particular, vertically-oriented adjustable resistance material layer 404c1 may be set to a low resistance or a high resistance based on a voltage applied to control terminal 408b. In operation, applying a voltage to control terminal 408b may cause the vertically-oriented adjustable resistance material layers 404c1 to become fully depleted of majority charge carriers.

In an embodiment, application of a first voltage to control terminal 408b sets vertically-oriented adjustable resistance material layer 404c1 to a first resistance, and application of a second voltage to control terminal 408b sets vertically-oriented adjustable resistance material layers 404c1 to a second resistance. In an embodiment, the first voltage may be between about 1V and about 5V above the lower of the voltages on terminals 408a and 408c, and the second voltage may be between about 0V and about 1V above the lower of the voltages on terminals 408a and 408c, although other voltages may be used. In an embodiment, the first resistance may be a low resistance, and the second resistance may be a high-resistance.

In operation, application of the first voltage to control terminal 408b forms a low resistance path (e.g., less than about 100 k$\Omega$) between first terminal 408a and third terminal 408c of vertically-oriented adjustable resistance structure 404c. Application of the second voltage to control terminal 408b forms a high resistance path (e.g., greater than about 10 M$\Omega$) between first terminal 408a and third terminal 408c of vertically-oriented adjustable resistance structure 404c. In this regard, vertically-oriented adjustable resistance structure 404c functions as a steering element that may be used to selectively couple reversible resistance-switching element 402 to bottom electrode 410.

Figure 4E:
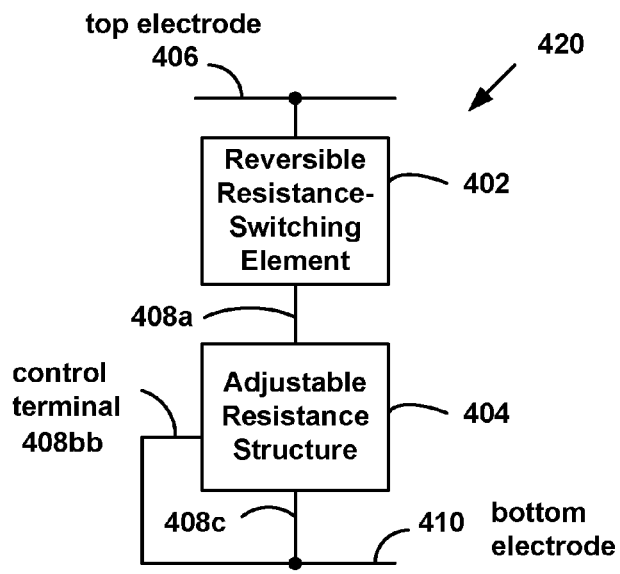
FIG. 4E depicts a block diagram of another embodiment of a memory cell including an adjustable resistance structure.

FIG. 4E is a simplified block diagram of an example memory cell 420 that includes a reversible resistance-switching element 402 coupled to a vertically-oriented adjustable resistance structure 404. Reversible resistance-switching element 402 has a first terminal coupled to a top electrode 406. Vertically-oriented adjustable resistance structure 404 includes a first terminal 408a coupled to a second terminal of reversible resistance-switching element 402, and a second (control) terminal 408bb and a third terminal 408c coupled together to bottom electrode 410.

In operation, with control terminal 408bb and third terminal 408c coupled to the same voltage, vertically-oriented adjustable resistance structure 404 functions as a non-linear resistor disposed between reversible resistance-switching element 402 and bottom electrode 410.

Memory cell 420 may be configured as memory cells 302c of FIG. 3C, with top electrode 406 coupled to one of bit lines BL1, BL2, . . . , BL10, and bottom electrode 410 coupled to one of word lines WL1, WL2, . . . , WL10.

Figure 4F:
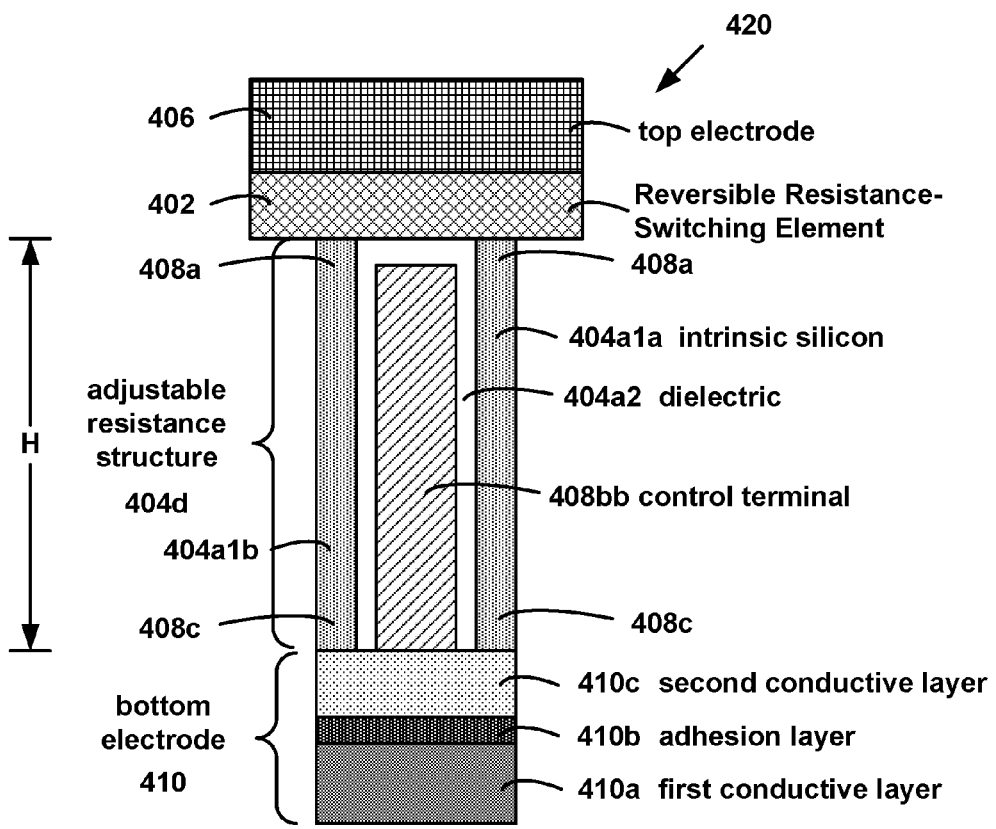
FIG. 4F depicts a cross-sectional view of example implementations of the memory cell of FIG. 4E.

FIG. 4F is a cross-sectional diagram of a memory cell 420, which is an example implementation of memory cell 420 of FIG. 4E. Memory cell 420 includes reversible resistance-switching element 402, vertically-oriented adjustable resistance structure 404d, top electrode 406 and bottom electrode 410. As described in more detail below, vertically-oriented adjustable resistance structure 404d functions as fixed resistor disposed between reversible resistance-switching element 402 and bottom electrode 410.

Vertically-oriented adjustable resistance structure 404d is disposed over second conductive layer 410c, and includes vertically-oriented adjustable resistance material layers 404a1a and 404a1b and dielectric material layer 404a2 disposed adjacent second (control) terminal 408bb. Vertically-oriented adjustable resistance structure 404a includes a first terminal 408a adjacent reversible resistance-switching element 402, and a third terminal 408c adjacent second conductive layer 410c. In an embodiment, vertically-oriented adjustable resistance structure 404d has a height H of between about 1500 angstroms and about 5000 angstroms, although other heights may be used.

In an embodiment, vertically-oriented adjustable resistance material layers 404a1a and 404a1b each have a long axis that is arranged in a direction that is substantially orthogonal to a substrate. In this regard, vertically-oriented adjustable resistance structure 404d may be a vertically-oriented pillar that is orthogonal to a silicon substrate. In some embodiments, vertically-oriented adjustable resistance structure 404d may be a rectangular pillar or a cylindrical pillar, although other pillar shapes may be used.

Vertically-oriented adjustable resistance material layers 404a1a and 404a1b may be intrinsic, undoped or lightly doped polycrystalline silicon (or polysilicon), undoped or lightly doped silicon germanium, or indium gallium arsenide. In an embodiment, the carrier concentration of the polycrystalline silicon may be between about $10^{15}$ carriers/cm$^3$ and about $10^{19}$ carriers/cm$^3$ at room temperature. Vertically-oriented adjustable resistance material layers 404a1a and 404a1b may be deposited by CVD or any suitable method. In an embodiment, vertically-oriented adjustable resistance layers 404a1a and 404a1b may be between about 50 angstroms and about 250 angstroms thick, although other thicknesses may be used.

Dielectric material layer 404a2 is disposed between and isolates control terminal 408b from vertically-oriented adjustable resistance material layers 404a1a and 404a1b. Dielectric material layer 404a2 may be an oxide layer, such as silicon dioxide, hafnium dioxide, or other similar oxide layer, or a nitride layer, such as silicon nitride. Dielectric material layer 404a2 may be deposited by CVD or any suitable method. Dielectric material layer 404a2 may have a thickness between about 20 angstroms and about 100 angstroms, although other thicknesses may be used.

Control terminal 408bb may include a conductive material, such as a metal (e.g., tungsten), metal nitride (e.g., TiN), highly doped polysilicon (e.g., n+ polysilicon), or other conductive material. Control terminal 408bb may by deposited by PVD, CVD or any suitable method. Control terminal 408bb may have a thickness between about 80 angstroms and about 500 angstroms, although other thicknesses may be used. Control terminal 408bb is disposed on and conductively coupled to bottom electrode 410.

In operation, with control terminal 408bb and third terminal 408c coupled to the same voltage, vertically-oriented adjustable resistance structure 404 functions as a non-linear resistor disposed between reversible resistance-switching element 402 and bottom electrode 410. If the voltage difference between first terminal 408a and the coupled terminal 408bb and third terminal 408c is less than about 0.5V, or less than about 1V, or less than about 2V, then vertically-oriented adjustable resistance material layers 404a1a and 404a1b are set to a high resistance, for example, about 10 M$\Omega$ or more. If the voltage difference between first terminal 408a and the coupled terminal 408bb and third terminal 408c is greater than about 0.5 V, or greater than about 1V, or greater than about 2V, then vertically-oriented adjustable resistance material layers 404a1a and 404a1b are set to a low resistance, for example, about 100 k$\Omega$ or less. In this regard, vertically-oriented adjustable resistance structure 404 functions as a two-terminal steering element that may be used to selectively couple reversible resistance-switching element 402 to bottom electrode 410.

Referring now to FIGS. 5A1-5I2, an example method of forming a memory array is described. In particular, FIGS. 5A1-5I2 illustrate an example method of forming a single row of a memory array, such as memory array 300a of FIG. 3A. With reference to FIGS. 5A1-5A2, substrate 500 is shown as having already undergone several processing steps. Substrate 500 may be any suitable substrate such as a silicon, germanium, silicon-germanium, undoped, doped, bulk, silicon-on-insulator (SOI) or other substrate with or without additional circuitry. For example, substrate 500 may include one or more n-well or p-well regions (not shown).

Isolation layer 502 is formed above substrate 500. In some embodiments, isolation layer 502 may be a layer of silicon dioxide, silicon nitride, silicon oxynitride or any other suitable insulating layer.

Following formation of isolation layer 502, a first conductive layer 410a is deposited over isolation layer 502. First Conductive layer 410a may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, first conductive layer 410a may comprise between about 200 and about 2500 angstroms of tungsten. Other conductive layer materials and/or thicknesses may be used. In some embodiments, an adhesion layer (not shown), such as titanium nitride or other similar adhesion layer material, may be disposed between isolation layer 502 and first conductive layer 410a.

Following formation of first conductive layer 410a, an adhesion layer 410b is formed over first conductive layer 410a (e.g., by PVD or another method). For example, adhesion layer 410b may be between about 20 and about 500 angstroms, and preferably about 100 angstroms, of titanium nitride or another suitable adhesion layer such as tantalum nitride, tungsten nitride, tungsten, molybdenum, combinations of one or more adhesion layers, or the like. Other adhesion layer materials and/or thicknesses may be employed. In some embodiments, adhesion layer 410b may be optional.

Following formation of adhesion layer 410b, a second conductive layer 410c is formed over adhesion layer 410b. For example, a heavily doped n+ silicon layer 410c may be deposited on adhesion layer 410b. In some embodiments, n+ silicon layer 410c is in an amorphous state as deposited. In other embodiments, n+ silicon layer 410c is in a polycrystalline state as deposited. CVD or another suitable process may be employed to deposit n+ silicon layer 410c.

In at least one embodiment, n+ silicon layer 410c may be formed, for example, from about 100 to about 500 angstroms, of phosphorus or arsenic doped silicon having a doping concentration of about $10^{21}$ cm$^{-3}$. Other layer thicknesses, doping types and/or doping concentrations may be used. N+ silicon layer 410c may be doped in situ, for example, by flowing a donor gas during deposition. Other doping methods may be used (e.g., implantation).

Following formation of n+ silicon layer 410c, a dielectric layer 503 is formed over n+ silicon layer 410c. In an embodiment, from about 3000 to about 7000 angstroms of silicon nitride ($Si_3N_4$) layer 503 may be deposited on n+ silicon layer 410c. CVD or another suitable process may be employed to deposit $Si_3N_4$ layer 503.

Following formation of $Si_3N_4$ layer 503, $Si_3N_4$ layer 503, n+ silicon layer 410c, adhesion layer 410b, and first conductive layer 410a are patterned and etched. For example, $Si_3N_4$ layer 503, n+ silicon layer 410c, n+ silicon layer 410c, adhesion layer 410b, and first conductive layer 410a may be patterned and etched using conventional lithography techniques, with a soft or hard mask, and wet or dry etch processing. In at least one embodiment, $Si_3N_4$ layer 503, n+ silicon layer 410c, n+ silicon layer 410c, adhesion layer 410b, and first conductive layer 410a are patterned and etched to form substantially parallel, substantially co-planar word lines WL. Example widths for word lines WL and/or spacings between word lines WL range between about 100 and about 2500 angstroms, although other conductor widths and/or spacings may be used.

After word lines WL have been formed, a dielectric material layer 504 is formed over substrate 100 to fill the voids between word lines WL. For example, approximately 3000-7000 angstroms of $SiO_2$ may be deposited on the substrate 500 and planarized using chemical mechanical polishing or an etchback process to form a planar surface 506. As depicted in FIG. 5A2, dielectric material layer 504 fills the gaps between word lines WL. Other dielectric materials such as silicon dioxide, silicon oxynitride, low K dielectrics, etc., and/or other dielectric material layer thicknesses may be used. Example low K dielectrics include carbon doped oxides, silicon carbon layers, or the like.

$Si_3N_4$ layer 503 is removed using, for example, $H_2PO_3$ at 70 C, or any isotropic etch method, resulting in the structure shown in FIGS. 5B1-5B2. Removal of $Si_3N_4$ layer results in trenches 508 above word lines WL.

In other embodiments, word lines WL may be formed using a damascene process in which dielectric material layer 504 is formed, patterned and etched to form etched trenches 508 for word lines WL. The openings or voids then may be filled with first conductive layer 410a, adhesion layer 410b, and n+ silicon layer 410c (and/or a conductive seed, conductive fill and/or barrier layer if needed). In such an embodiment, first conductive layer 410a will line the bottom and sidewalls of each trench 508.

An adjustable resistance material layer 404a1 is deposited conformally in trenches 508. For example, between about 50 angstroms and about 250 angstroms of intrinsic or undoped polysilicon may be deposited, resulting in the structure shown in FIGS. 5C1-5C2. Alternatively, adjustable resistance material layer 404a1 may be undoped silicon germanium, or indium gallium arsenide. In an embodiment, adjustable resistance material layer 404a1 is intrinsic or undoped polysilicon, having a carrier concentration of between about $10^{15}$ carriers/cm$^3$ and about $5 \times 10^{17}$ carriers/cm$^3$ at room temperature. For simplicity, adjustable resistance material layer 404a1 also will be referred to herein as intrinsic polysilicon layer 404a1.

An anisotropic etch is used to remove lateral portions of intrinsic polysilicon layer 404a1, leaving only sidewall portions of gate intrinsic polysilicon layer 404a1 on the sides of trenches 508, resulting in the structure shown in FIGS. 5D1-5D2. For example, a sputter etch, a chemical etch, or other suitable process may be used to anisotropically etch intrinsic polysilicon layer 404a1.

A dielectric layer 404a2 is deposited conformally over substrate 500. For example, between about 20 to about 100 angstroms of silicon dioxide may be deposited, resulting in the structure illustrated in FIGS. 5E1-5E2. Other dielectric materials such as silicon nitride, silicon oxynitride, high K dielectrics, etc., and/or other dielectric material layer thicknesses may be used.

Control terminal material 408b is deposited over substrate 500 to fill remaining voids in trenches 508. For example, approximately 100 to 2000 angstroms of such as titanium nitride or other similar metal, a highly-doped semiconductor, such as n+ polysilicon, p+ polysilicon, or other similar conductive material may be deposited. The as-deposited control terminal material 408b is subsequently etched back to expose the top of intrinsic polysilicon layer 404a1.

The control terminal material 408b is further etched to recess the control terminals below the top surface of intrinsic polysilicon layer 404a1. The control terminal material 408b may be recessed between 100 and 500 Angstroms from the top of intrinsic polysilicon layer 404a1. Dry etching, chemical-mechanical polishing, or a combination of the two may be used to planarize and recess control terminal material 408b. A dielectric material layer 510 is deposited over the recessed control terminal material 408b. For example, approximately 100 to 800 angstroms of silicon dioxide may be deposited and planarized using chemical mechanical polishing or an etch-back process to form a planar surface 512, resulting in the structure illustrated in FIGS. 5F1-5F2.

Following planarization, a reversible resistance-switching material layer 402 is deposited over substrate 500. Reversible resistance-switching material layer 402 may be a metal oxide, solid electrolyte, phase-change material, magnetic material, or other similar resistivity-switching material. Various metal oxides can be used, such as transition metal-oxides. Examples of metal-oxides include, but are not limited to, $NiO$, $Nb_2O_5$, $TiO_2$, $HfO_2$, $Al_2O_3$, $MgO_x$, $CrO_2$, $VO$, $BN$, $TaO_2$, $Ta_2O_3$, and $AlN$. Reversible resistance-switching material layer 402 may be deposited by any suitable method (e.g., CVD, PVD, etc.). In at least one embodiment, reversible resistance-switching material layer 402 may be between about 8 and about 80 angstroms of $HfO_2$. Persons of ordinary skill in the art will understand that other metal oxide materials, other resistivity-switching materials, thicknesses and other deposition techniques may be used.

Top electrode layer 406 is deposited over resistivity-switching material layer 402, resulting in the structure shown in FIGS. 5G1-5G2. Top electrode layer 406 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, Top electrode layer 406 may comprise between about 200 and about 5000 angstroms of tungsten. Other conductive layer materials and/or thicknesses may be used.

Top electrode layer 406, resistivity-switching material layer 402 and intrinsic polysilicon layer 404a1, are patterned and etched to form etched rows 514, resulting in the structure shown in FIGS. 5H1-5H2. In at least one embodiment, top electrode layer 406, resistivity-switching material layer 402, and intrinsic polysilicon layer 404a1 are patterned and etched to form substantially parallel, substantially co-planar bit lines BL. Example widths for bit lines BL and/or spacings between bit lines BL range between about 100 and about 2500 angstroms, although other conductor widths and/or spacings may be used.

The memory cell layers may be patterned and etched in a single pattern/etch procedure or using separate pattern/etch steps. For example, photoresist may be deposited, patterned using standard photolithography techniques, layers 406, 402 and 404a1 may be etched, and then the photoresist may be removed. Alternatively, a hard mask of some other material, for example silicon dioxide, may be formed on top of top electrode layer 406, with bottom antireflective coating ("BARC") on top, then patterned and etched. Similarly, dielectric antireflective coating ("DARC") and/or amorphous carbon film (e.g., the Advanced Patterning Film from Applied Materials, Santa Clara, Calif.) may be used as a hard mask.

Any suitable masking and etching process may be used to form etched rows 514. For example, layers 406, 402 and 404a1 may be patterned with about 1 to about 1.5 micron, more preferably about 1.2 to about 1.4 micron, of PR using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, rows 514 may be cleaned using a dilute hydrofluoric/sulfuric acid clean. Such cleaning may be performed in any suitable cleaning tool, such as a Raider tool, available from Semitool of Kalispell, Mont. Example post-etch cleaning may include using ultra-dilute sulfuric acid (e.g., about 1.5 1.8 wt %) for about 60 seconds and/or ultra-dilute hydrofluoric (HF) acid (e.g., about 0.4-0.6 wt %) for 60 seconds. Megasonics may or may not be used. Other clean chemistries, times and/or techniques may be employed.

A dielectric material layer 516 is deposited over substrate 500 to fill the voids between rows 514. For example, approximately 2000-7000 angstroms of silicon dioxide may be deposited and planarized using chemical mechanical polishing or an etch-back process to form a planar surface 518, resulting in the structure illustrated in FIGS. 5I1-5I2. Planar surface 518 includes exposed top surfaces of rows 514 separated by dielectric material 516 (as shown). Other dielectric materials such as silicon nitride, silicon oxynitride, low K dielectrics, etc., and/or other dielectric material layer thicknesses may be used.

One embodiment of the disclosed technology includes a memory cell that includes a vertically-oriented adjustable resistance structure including a control terminal coupled to a word line, and a reversible resistance-switching element coupled in series with and disposed above or below the vertically-oriented adjustable resistance structure One embodiment of the disclosed technology includes a memory cell that includes a reversible resistance-switching element, and a steering element coupled in series with and disposed above or below the reversible resistance-switching element. The steering element includes a vertically-oriented adjustable resistance structure comprising a control terminal coupled to a word line.

One embodiment of the disclosed technology includes a method that includes providing a memory cell including a vertically-oriented adjustable resistance structure including a control terminal coupled to a word line, and a reversible resistance-switching element coupled in series with and disposed above or below the vertically-oriented adjustable resistance structure. The method further includes applying a first voltage to the control terminal to set the vertically-oriented adjustable resistance structure to a first conducting state, and applying a second voltage to the control terminal to set the vertically-oriented adjustable resistance structure to a second conducting state.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A memory cell comprising:
   a vertically-oriented adjustable resistance material layer;
   a control terminal disposed adjacent the vertically-oriented adjustable resistance material layer and coupled to a word line; and
   a reversible resistance-switching element disposed on the vertically-oriented adjustable resistance material layer, wherein the control terminal is configured to adjust a resistance of the vertically-oriented adjustable resistance material layer.

2. The memory cell of claim 1, further comprising a dielectric material layer disposed between the control terminal and the vertically-oriented adjustable resistance material layer.

3. The memory cell of claim 1, further comprising a plurality of vertically-oriented adjustable resistance material layers, wherein the reversible resistance-switching element is disposed on the plurality of vertically-oriented adjustable resistance material layers.

4. The memory cell of claim 1, wherein the vertically-oriented adjustable resistance material layer comprises a semiconductor material.

5. The memory cell of claim 1, wherein the vertically-oriented adjustable resistance material layer is fully depleted of majority charge carriers when a voltage is applied to the control terminal.

6. The memory cell of claim 1, wherein the vertically-oriented adjustable resistance material layer comprises any of intrinsic or undoped polycrystalline silicon, undoped silicon germanium, and indium gallium arsenide.

7. The memory cell of claim 1, further comprising:
   a first terminal coupled via the reversible resistance-switching element to a bit line; and
   a third terminal coupled to a common potential.

8. The memory cell of claim 1, further comprising:
   a first terminal coupled to a bit line; and
   a third terminal coupled via the reversible resistance-switching element to a common potential.

9. The memory cell of claim 1, further comprising:
   a first terminal coupled via the reversible resistance-switching element to a bit line; and
   a third terminal coupled to the control terminal.

10. The memory cell of claim 1, wherein reversible resistance-switching element comprises any of a metal oxide, a solid electrolyte, a phase-change material, and a magnetic material.

11. The memory cell of claim 1, wherein reversible resistance-switching element comprises any of NiO, $Nb_2O_5$, $TiO_2$, $HfO_2$, $Al_2O_3$, $MgO_x$, $CrO_2$, VO, BN, $TaO_2$, $Ta_2O_3$, and AlN.

12. A memory cell comprising:
    a reversible resistance-switching element; and
    a steering element disposed on the reversible resistance-switching element, wherein the steering element comprises:
    a vertically-oriented adjustable resistance material layer; and
    a control terminal disposed adjacent the vertically-oriented adjustable resistance material layer and coupled to a word line.

13. The memory cell of claim 12, wherein the steering element further comprises a dielectric material layer disposed between the vertically-oriented adjustable resistance material layer and the control terminal.

14. The memory cell of claim 12, wherein the steering element further comprises a first vertically-oriented adjustable resistance material layer, and a second vertically-oriented adjustable resistance material layer, and the control terminal is disposed between the first vertically-oriented adjustable resistance material layer and the second vertically-oriented adjustable resistance material layer.

15. The memory cell of claim 12, wherein the vertically-oriented adjustable resistance material layer comprises a semiconductor material.

16. The memory cell of claim 12, wherein the vertically-oriented adjustable resistance material layer is fully depleted of majority charge carriers when a voltage is applied to the control terminal.

17. The memory cell of claim 12, wherein the vertically-oriented adjustable resistance material layer comprises any of intrinsic or undoped polycrystalline silicon, undoped silicon germanium, and indium gallium arsenide.

18. The memory cell of claim 12, wherein reversible resistance-switching element comprises any of a metal oxide, a solid electrolyte, a phase-change material, and a magnetic material.

19. The memory cell of claim 12, wherein reversible resistance-switching element comprises any of NiO, $Nb_2O_5$, $TiO_2$, $HfO_2$, $Al_2O_3$, $MgO_x$, $CrO_2$, VO, BN, $TaO_2$, $Ta_2O_3$, and AlN.

20. A method comprising:
    forming a first electrode;
    forming a vertically-oriented adjustable resistance material layer above the first electrode;
    forming a control terminal coupled to a word line and disposed adjacent the vertically-oriented adjustable resistance material layer; and
    forming a reversible resistance-switching element on the vertically-oriented adjustable resistance material layer;
    wherein the control terminal is configured to set the vertically-oriented adjustable resistance material layer to a plurality of resistances.

* * * * *